(12) United States Patent
Kawahito

(10) Patent No.: US 8,289,427 B2
(45) Date of Patent: Oct. 16, 2012

(54) SEMICONDUCTOR RANGE-FINDING ELEMENT AND SOLID-STATE IMAGING DEVICE

(75) Inventor: Shoji Kawahito, Hamamatsu (JP)

(73) Assignee: National University Corporation Shizuoka University, Shizuoka-shi (JP)

( * ) Notice: Subject to any disclaimer, the term of this patent is extended or adjusted under 35 U.S.C. 154(b) by 337 days.

(21) Appl. No.: 12/516,635

(22) PCT Filed: Nov. 30, 2007

(86) PCT No.: PCT/JP2007/073215
§ 371 (c)(1),
(2), (4) Date: May 28, 2009

(87) PCT Pub. No.: WO2008/069141
PCT Pub. Date: Jun. 12, 2008

(65) Prior Publication Data
US 2010/0073541 A1     Mar. 25, 2010

(30) Foreign Application Priority Data
Nov. 30, 2006   (JP) ................................. 2006-324501

(51) Int. Cl.
*H04N 5/335* (2011.01)
(52) U.S. Cl. ................... 348/302; 348/294; 257/290
(58) Field of Classification Search .............. 348/294, 348/302
See application file for complete search history.

(56) References Cited

U.S. PATENT DOCUMENTS

| | | | | |
|---|---|---|---|---|
| 7,138,646 B2 * | 11/2006 | Hashimoto et al. | ...... | 250/559.38 |
| 7,145,128 B2 * | 12/2006 | Tanaka | ...... | 250/231.13 |
| 7,622,758 B2 * | 11/2009 | Hynecek | ...... | 257/292 |

(Continued)

FOREIGN PATENT DOCUMENTS
JP   1 189158   7/1989
(Continued)

OTHER PUBLICATIONS

Sawada, Tomonari et al., "CMOS Range Image Sensor", ITE Technical Report, vol. 30, No. 52, pp. 21-24, 2006, (with English abstract).
(Continued)

*Primary Examiner* — Jordan Schwartz

(74) *Attorney, Agent, or Firm* — Oblon, Spivak, McClelland, Maier & Neustadt, L.L.P.

(57) ABSTRACT

A semiconductor range-finding element encompasses a semiconductor region (1), a light receiving surface-buried region (11a), a first charge-accumulation region (12a), a first charge read-out region (13), a first potential control means (31), a second potential control means (32), a first exhausting-drain region (14) and a third potential control means (33). The signal charges dependent on a delay time of the reflected light are repeatedly transferred from the light receiving surface-buried region (11a) to the first charge-accumulation region (12a) so as to be accumulated as a first signal charge in the first charge-accumulation region (12a) in a first repetition period, all of the signal charges generated by the reflected light are repeatedly transferred from the light receiving surface-buried region (11a) to the first charge-accumulation region (12a) so as to be accumulated as a second signal charge in the first charge-accumulation region (12a) in a second repetition period. A ratio between total quantities of the accumulated first and second signal charges is calculated so as to measure a range to a target sample.

11 Claims, 17 Drawing Sheets

U.S. PATENT DOCUMENTS

| | | | |
|---|---|---|---|
| 7,781,811 B2 * | 8/2010 | Kawahito et al. | 257/292 |
| 7,910,964 B2 * | 3/2011 | Kawahito et al. | 257/292 |
| 2004/0213463 A1 * | 10/2004 | Morrison | 382/210 |
| 2005/0178946 A1 * | 8/2005 | Hashimoto et al. | 250/208.1 |
| 2006/0192938 A1 | 8/2006 | Kawahito | |
| 2007/0057209 A1 * | 3/2007 | Kurihara et al. | 250/559.38 |
| 2007/0158770 A1 | 7/2007 | Kawahito | |
| 2008/0277700 A1 | 11/2008 | Kawahito | |
| 2009/0114919 A1 * | 5/2009 | Kawahito et al. | 257/59 |
| 2009/0134396 A1 | 5/2009 | Kawahito et al. | |

FOREIGN PATENT DOCUMENTS

| | | |
|---|---|---|
| JP | 4 268764 | 9/1992 |
| JP | 2001 268445 | 9/2001 |
| JP | 2002 368205 | 12/2002 |
| JP | 2004 294420 | 10/2004 |
| JP | 2005 235893 | 9/2005 |
| JP | 2006-120685 | 5/2006 |
| JP | 2008-135800 | 6/2008 |
| JP | 4649623 | 12/2010 |
| WO | WO 2007/026777 A1 | 3/2007 |
| WO | WO 2007/026779 A1 | 3/2007 |
| WO | 2007 119626 | 10/2007 |

OTHER PUBLICATIONS

Miyagawa, Ryohei et al., "CCD-Based Range-Finding Sensor", IEEE Transactions on Electron Devices, vol. 44, No. 10, pp. 1648-1652, (1997).

U.S. Appl. No. 12/065,158, Feb. 28, 2008, Kawahito, et al.

Office Action issued Oct. 4, 2011 in Japanese Patent Application No. 2008-548264.

* cited by examiner

FIG. 3
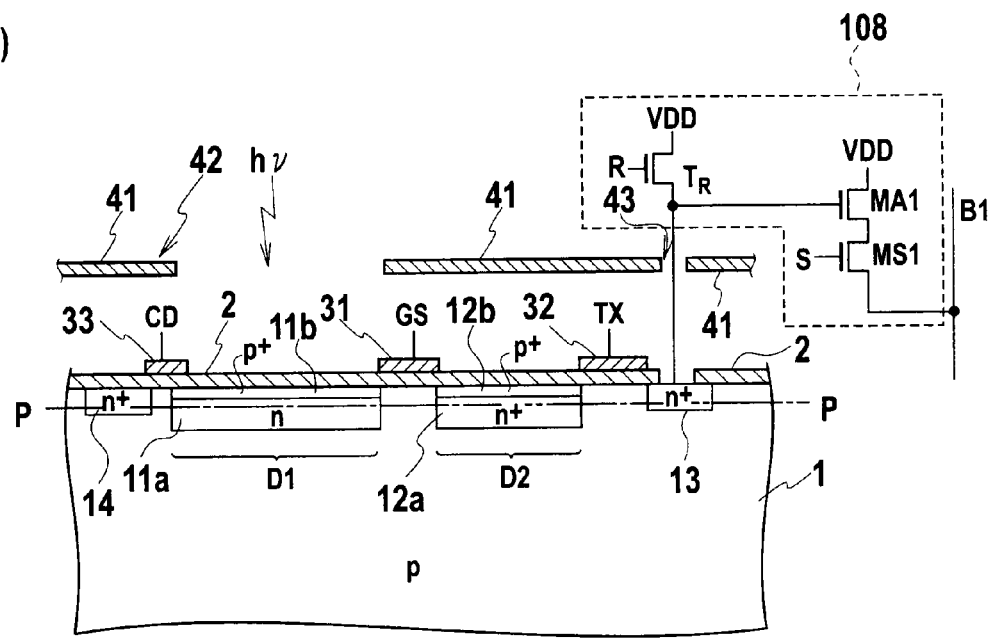
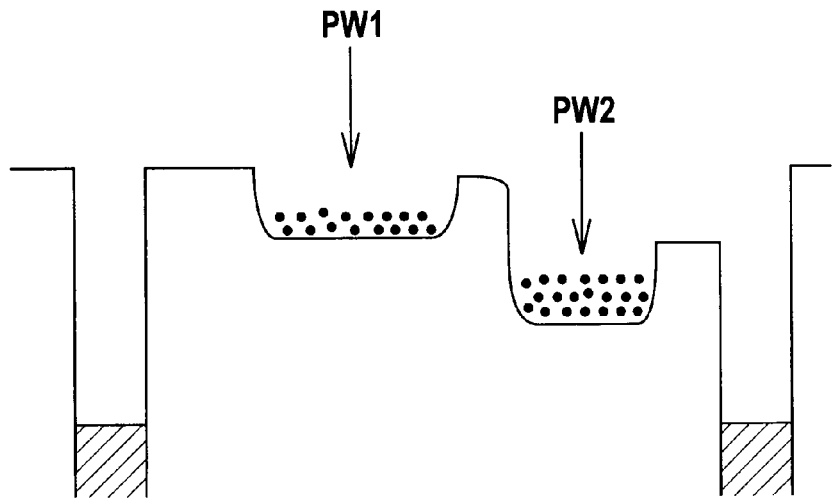

FIG. 4
(a)
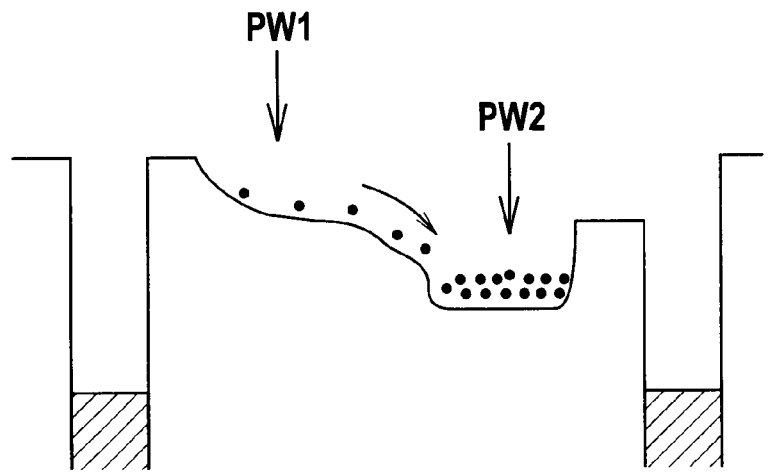
(b)
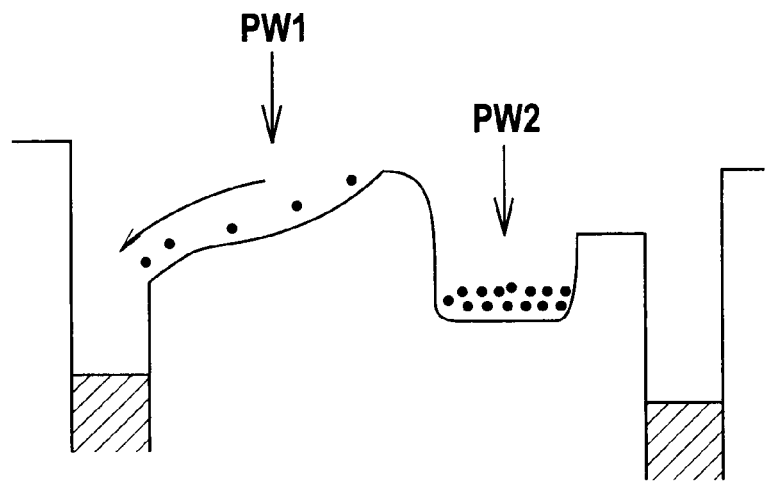
(c)
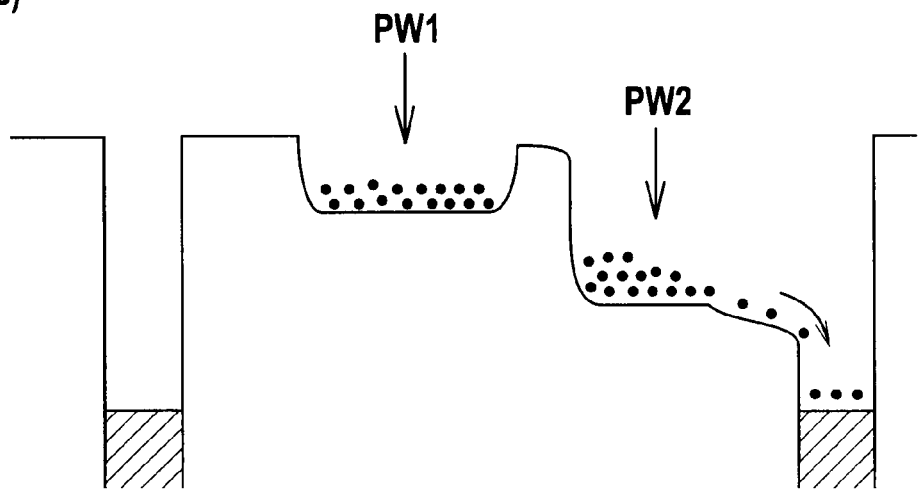

FIG. 7
(a)
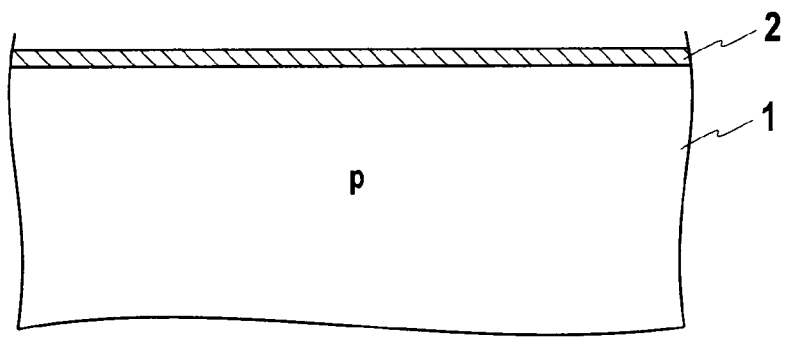
(b)
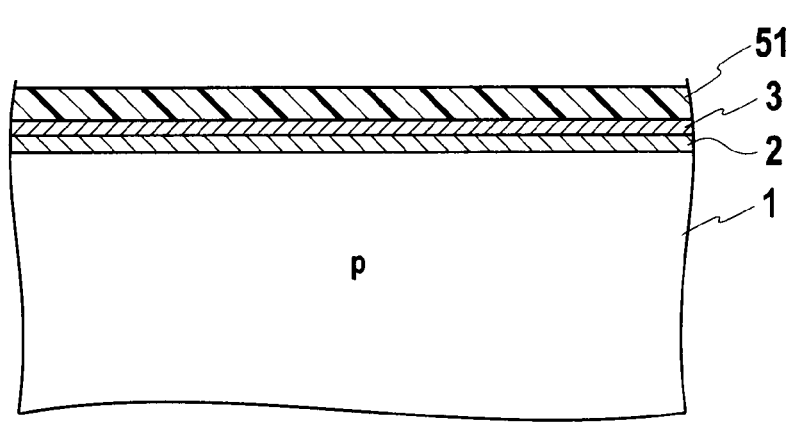
(c)
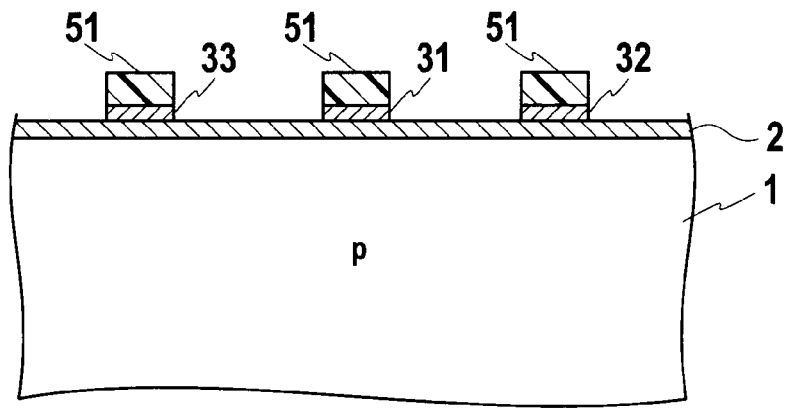

FIG. 8
(a)
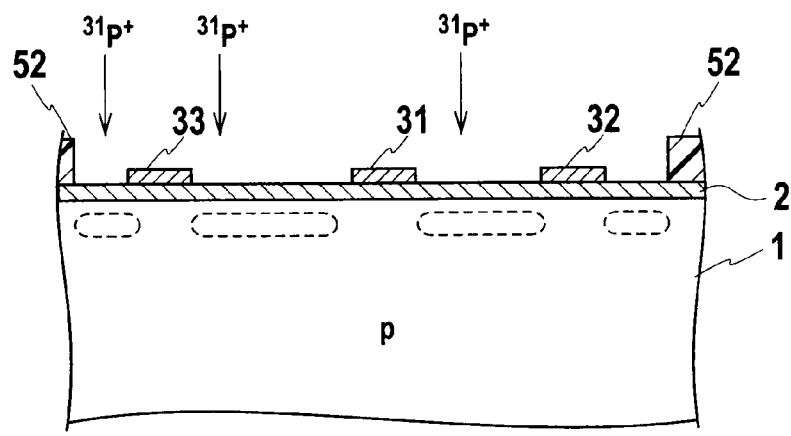
(b)
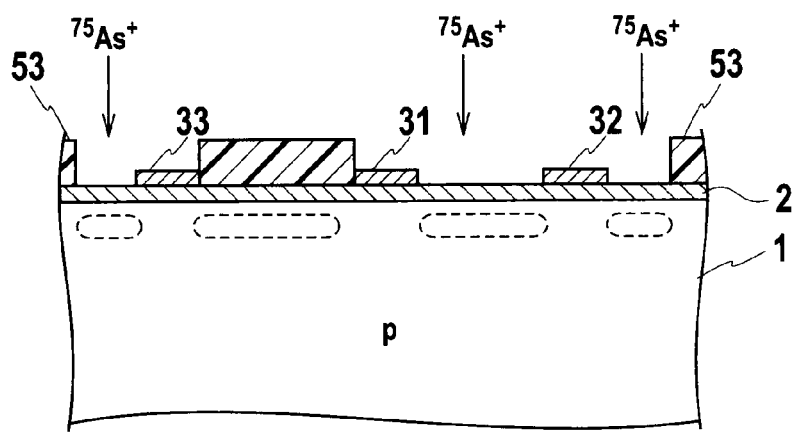
(c)
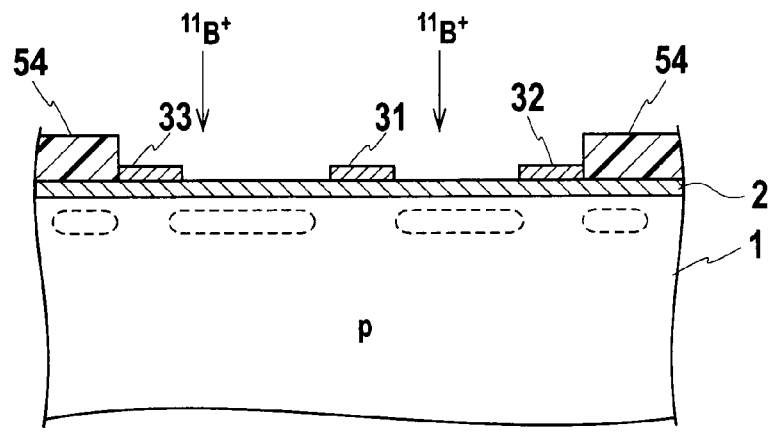

FIG. 10
(a)
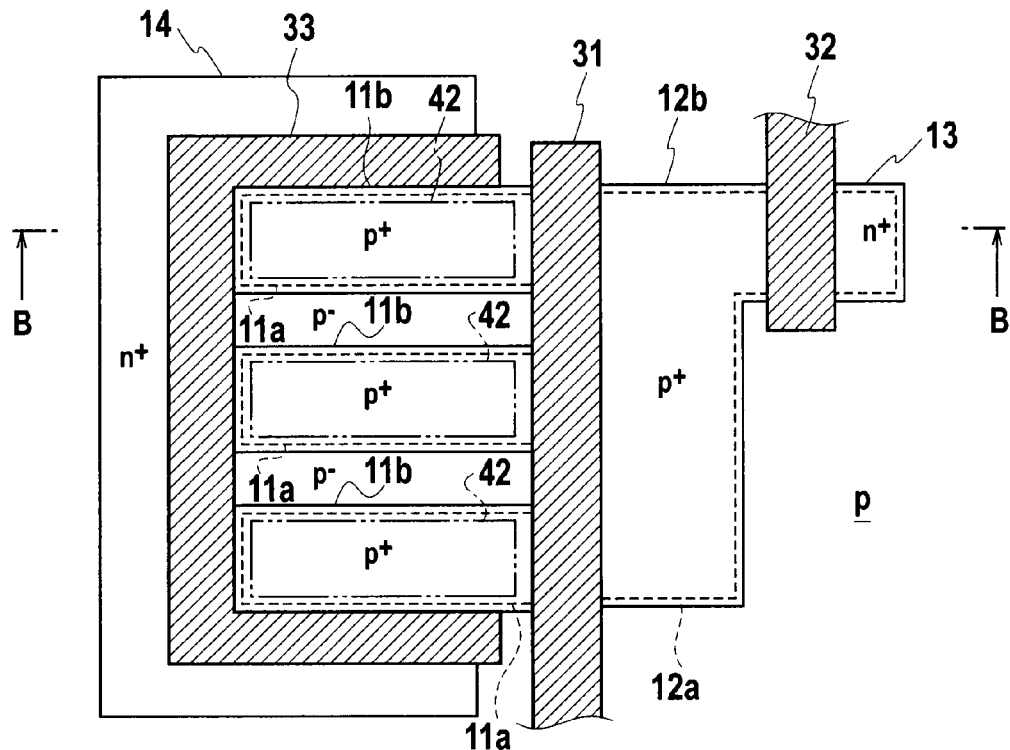
(b)
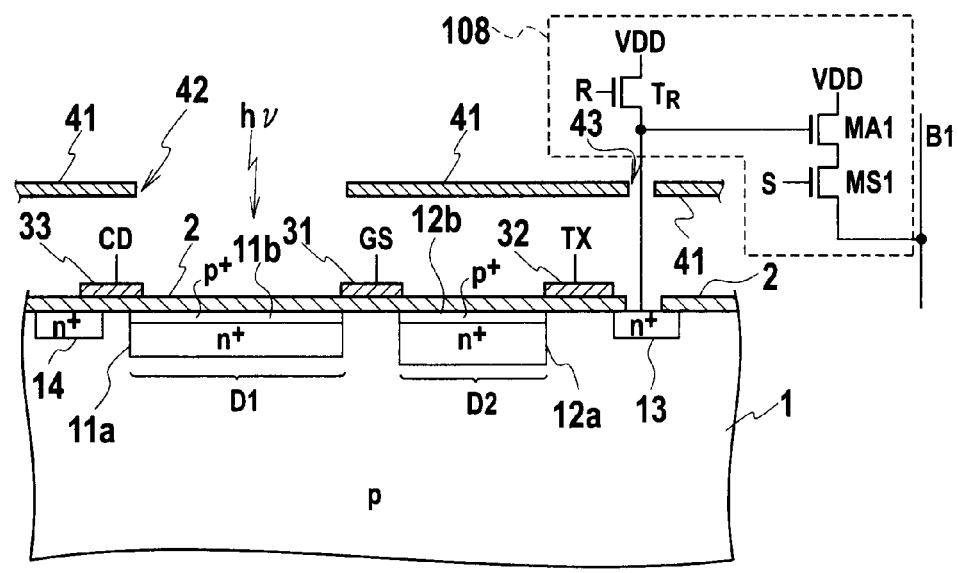

FIG. 14
(a)
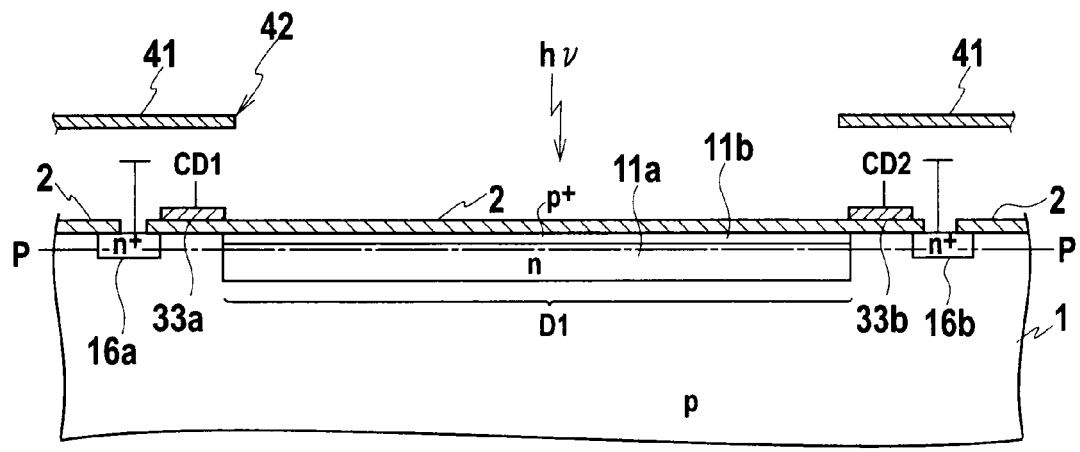
(b)
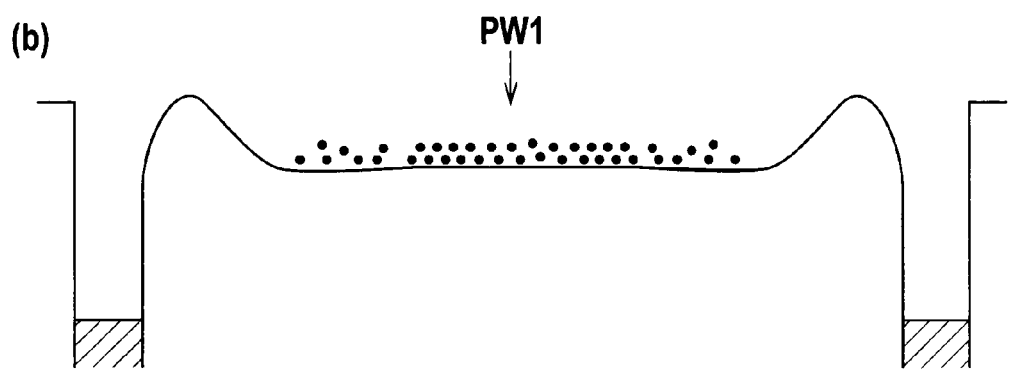
(c)
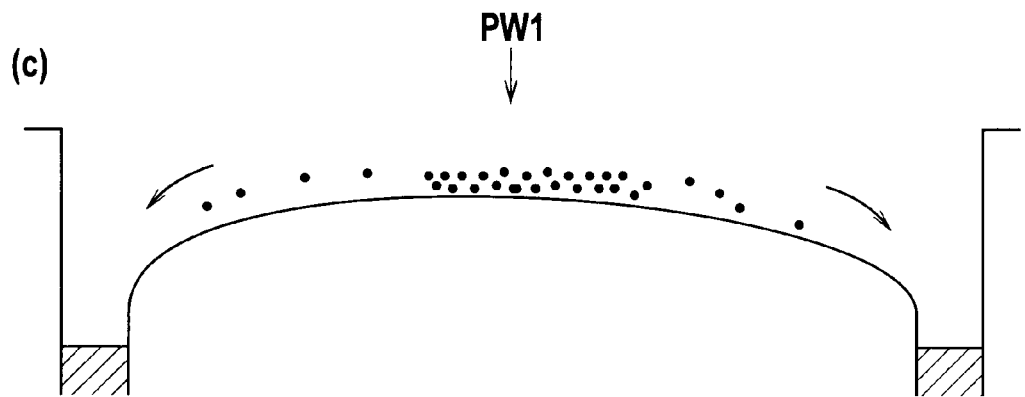

SEMICONDUCTOR RANGE-FINDING ELEMENT AND SOLID-STATE IMAGING DEVICE

FIELD OF THE INVENTION

The present invention relates to a semiconductor range-finding element and a solid-state imaging device in which a plurality of semiconductor range-finding elements are arrayed.

DESCRIPTION OF THE RELATED ART

Starting with a one-dimensional range-finding sensor that uses CCD announced in about 1995, the development of a time-of-flight (TOF) range-finding sensor for using a flight time of light and obtaining a Range Image has advanced in many fields.

However, the resolution of the currently available TOF range-finding sensor remains within about 20,000 pixels. Also, in the case of a method of using the CCD, as the number of the pixels is increased, it becomes difficult to drive the pixels. In the method of using the mixed process of CMOS and CCD, its manufacturing cost becomes expensive.

On the other hand, one of the present inventors already proposes the method based on a CMOS technique, which is effective for achieving a high sensibility and carries out a charge transfer at a high speed.

However, the conventional TOF range-finding sensor has a point to be improved from the viewpoint of a range resolution and a space resolution. Thus, the TOF range-finding sensor that is low in cost and has a high range resolution and a high space resolution is desired.

SUMMARY OF THE INVENTION

An objective of the present invention is to provide a semiconductor range-finding element that can perform a high speed charge transfer, and further, by arranging a plurality of semiconductor range-finding elements as pixels, to provide a solid-state imaging device having a high range resolution and a high space resolution, which can be manufactured at a low cost.

A first aspect of the present invention inheres in a semiconductor range-finding element encompassing (a) a semiconductor region of a first conductivity type, (b) a light receiving surface-buried region of a second conductivity type buried in a part of an upper portion of the semiconductor region, to which a light reflected by a target sample is entered, (c) a first charge-accumulation region of the second conductivity type buried in a part of the upper portion of the semiconductor region and in which a depth of a potential well is deeper than the light receiving surface-buried region, to which signal charges generated by the light are transferred from the light receiving surface-buried region, (d) a first charge read-out region configured to receive the signal charges from the first charge-accumulation region, (e) a first potential control means configured to control a potential of a channel formed in the upper portion of the semiconductor region between the light receiving surface-buried region and the first charge-accumulation region and to transfer the signal charges from the light receiving surface-buried region to the first charge-accumulation region, (f) a second potential control means configured to control a potential of a channel formed in the upper portion of the semiconductor region between the first charge-accumulation region and the first charge read-out region and to transfer the signal charges from the first charge-accumulation region to the first charge read-out region, (g) a first exhausting-drain region configured to extract the charges from the light receiving surface-buried region and (h) a third potential control means configured to control a potential of a channel formed in the upper portion of the semiconductor region between the light receiving surface-buried region and the first exhausting-drain region and to transfer the signal charges from the light receiving surface-buried region to the first exhausting-drain region. Where the signal charges dependent on a delay time of the reflected light are repeatedly transferred from the light receiving surface-buried region to the first charge-accumulation region so as to be accumulated as a first signal charge in the first charge-accumulation region in a first repetition period, all of the signal charges generated by the reflected light are repeatedly transferred from the light receiving surface-buried region to the first charge-accumulation region so as to be accumulated as a second signal charge in the first charge-accumulation region in a second repetition period, and a ratio between total quantities of the accumulated first and second signal charges is calculated so as to measure a range to the target sample.

A second aspect of the present invention inheres in a solid-state imaging device including a plurality of pixels being arrayed. Each of the pixels encompasses (a) a semiconductor region of a first conductivity type, (b) a light receiving surface-buried region of a second conductivity type buried in a part of an upper portion of the semiconductor region, to which a light reflected by a target sample is entered, (c) a first charge-accumulation region of the second conductivity type buried in a part of the upper portion of the semiconductor region, a depth of a potential well of the first charge-accumulation region is deeper than the light receiving surface-buried region, and to which signal charges generated by the light are transferred from the light receiving surface-buried region, (d) a first charge read-out region configured to receive the signal charges from the first charge-accumulation region, (e) a first potential control means configured to control a potential of a channel formed in the upper portion of the semiconductor region between the light receiving surface-buried region and the first charge-accumulation region configured to transfer the signal charges from the light receiving surface-buried region to the first charge-accumulation region, (f) a second potential control means configured to control a potential of a channel formed in the upper portion of the semiconductor region between the first charge-accumulation region and the first charge read-out region configured to transfer the signal charges from the first charge-accumulation region to the first charge read-out region, (g) a first exhausting-drain region configured to extract the charges from the light receiving surface-buried region and (h) a third potential control means configured to control a potential of a channel formed in the upper portion of the semiconductor region between the light receiving surface-buried region and the first exhausting-drain region configured to transfer the signal charges from the light receiving surface-buried region to the first exhausting-drain region. Where the signal charges dependent on a delay time of the reflected light are repeatedly transferred from the light receiving surface-buried region to the first charge-accumulation region so as to be accumulated as a first signal charge in the first charge-accumulation region in a first repetition period, all of the signal charges generated by the reflected light are repeatedly transferred from the light receiving surface-buried region so as to be accumulated as a second signal charge in the first charge-accumulation region in a second repetition period, and a ratio between total quantities of the accumulated first and second signal charges is calculated so as to measure a range to the target sample.

BRIEF DESCRIPTION OF THE DRAWINGS

FIG. 3(a) is a schematic cross-sectional view when viewed from an A-A plane in FIG. 2, and FIG. 3(b) is a potential diagram describing a manner of a transferring of signal charges;

FIG. 4 (a) is a potential diagram describing the way of the transferring of the signal charges, FIG. 4(b) is a potential diagram describing the way of the transferring of the signal charges, and FIG. 4(c) is a potential diagram describing the way of the transferring of the signal charges;

FIG. 7 (a), FIG. 7 (b) and FIG. 7 (c) are process-flow cross-sectional views describing a method for manufacturing the semiconductor range-finding element and the solid-state imaging device, pertaining to the first embodiment of the present invention;

FIG. 8 (a), FIG. 8 (b) and FIG. 8 (c) are process-flow cross-sectional views describing the method for manufacturing the semiconductor range-finding element and the solid-state imaging device, pertaining to the first embodiment of the present invention;

FIG. 10 (a) is a schematic cross-sectional view describing the configuration of the semiconductor range-finding element that serves as the part of the pixels of the solid-state imaging device pertaining to the modification of the first embodiment of the present invention, and FIG. 10 (b) is a schematic cross-sectional view when viewed from a B-B plane in FIG. 10 (a);

FIG. 14 (a) is a schematic cross-sectional view when viewed from a D-D plane in FIG. 11, FIG. 14 (b) is a potential diagram describing the way of the transferring of the signal charges, and FIG. 14 (c) is a potential diagram describing the way of the transferring of the signal charges;

DETAILED DESCRIPTION OF THE EMBODIMENTS

Figure 1:
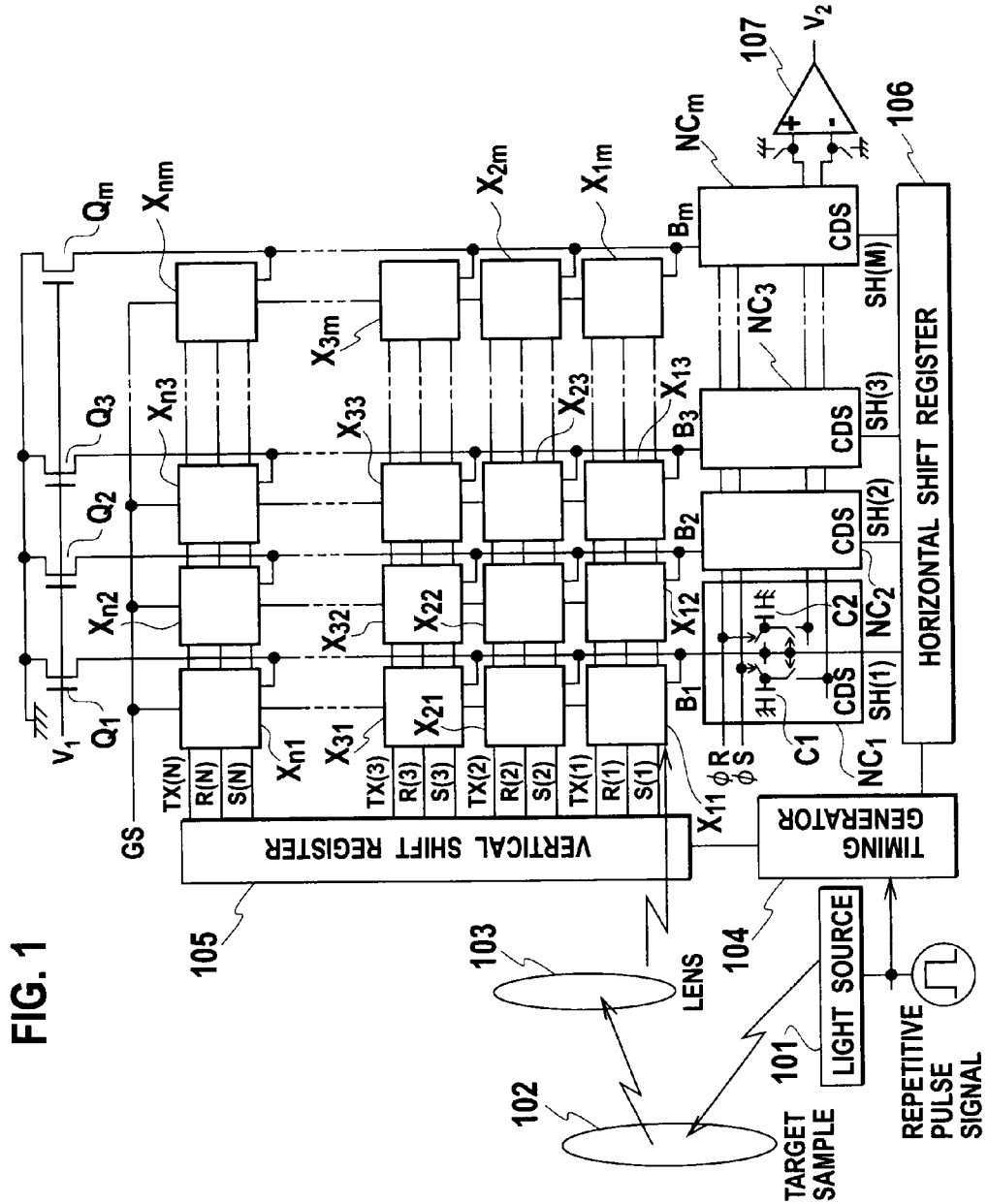
FIG. 1 is a schematic plan view describing a layout of a semiconductor chip of a solid-state imaging device (two-dimensional image sensor) pertaining to a first embodiment of the present invention.

The first and second embodiments of the present invention will be described below with reference to the drawings. In the illustrations of the following drawings, the same or similar reference numerals are given to the same or similar portions. However, attention should be paid to the fact that, since the drawings are only diagrammatic, the relation between the thickness and the flat surface dimension, and the ratio between the thicknesses of respective layers, and the like differ from the actual members. Thus, the specific thicknesses and dimensions should be judged by referring to the following descriptions. Also, of course, the portions in which the mutual dimensional relations and ratios are different are included even between the mutual drawings.

Also, the following first and second embodiments only exemplify the apparatus and method that embody the technical idea of the present invention. In the technical idea of the present invention, the materials, shapes, structures, arrangements and the like of the configuration parts are not limited to the following items. Various modifications can be applied to the technical idea of the present invention, within the technical scope described in claims.

First Embodiment

In a solid-state imaging device (two-dimensional image sensor) pertaining to a first embodiment of the present invention, as shown in FIG. 1, a pixel array area ($X_{11}$ to $X_{1m}$; $X_{21}$ to $X_{2m}$; . . . ; $X_{n1}$ to $X_{nm}$) and peripheral circuit areas (104, 105, 106, and $NC_1$ to $NC_m$) are integrated on the same semiconductor chip. In the pixel array area, a large number of pixels $X_{ij}$ (i=1 to m; j=1 to n; where m, n are integers, respectively) are arrayed in the shape of a two-dimensional matrix, and a rectangular imaging area is established. Then, at the lower side of the pixel array area, a horizontal shift register 106 is provided along pixel rows $X_{11}$ to $X_{1m}$; $X_{21}$ to $X_{2m}$; . . . ; $X_{n1}$ to $X_{nm}$ directions. At the left side of the pixel array area, a vertical shift register 105 is provided along pixel columns $X_{11}$ to $X_{n1}$; $X_{12}$ to $X_{n2}$; . . . ; $X_{1j}$ to $X_{nj}$; . . . $X_{1m}$ to $X_{nm}$ directions. A timing generator 104 is connected to the vertical shift register 105 and the horizontal shift register 106.

The timing generator 104, the horizontal shift register 106 and the vertical shift register 105 sequentially scan the pixels Xij in the pixel array area, so that the reading out of pixel signals and an electronic shuttering operation can be executed. That is, the solid-state imaging device D pertaining to the first embodiment of the present invention, the pixel array area is vertically scanned along the direction of arrangement of pixel rows $X_{11}$ to $X_{1m}$; $X_{21}$ to $X_{2m}$; . . . ; $X_{n1}$ to $X_{nm}$, and pixel signals of each of the pixel rows $X_{11}$ to $X_{1m}$; $X_{21}$ to $X_{2m}$; . . . ; $X_{n1}$ to $X_{nm}$ are read out through the vertical signal lines assigned to each of pixel columns $X_{11}$ to $X_{n1}$; $X_{12}$ to $X_{n2}$; . . . ; $X_{1j}$ to $X_{nj}$; . . . ; $X_{1m}$ to $X_{nm}$, in the units of pixel rows $X_{11}$ to $X_{1m}$; $X_{21}$ to $X_{2m}$; . . . ; $X_{n1}$ to $X_{nm}$.

Figure 2:
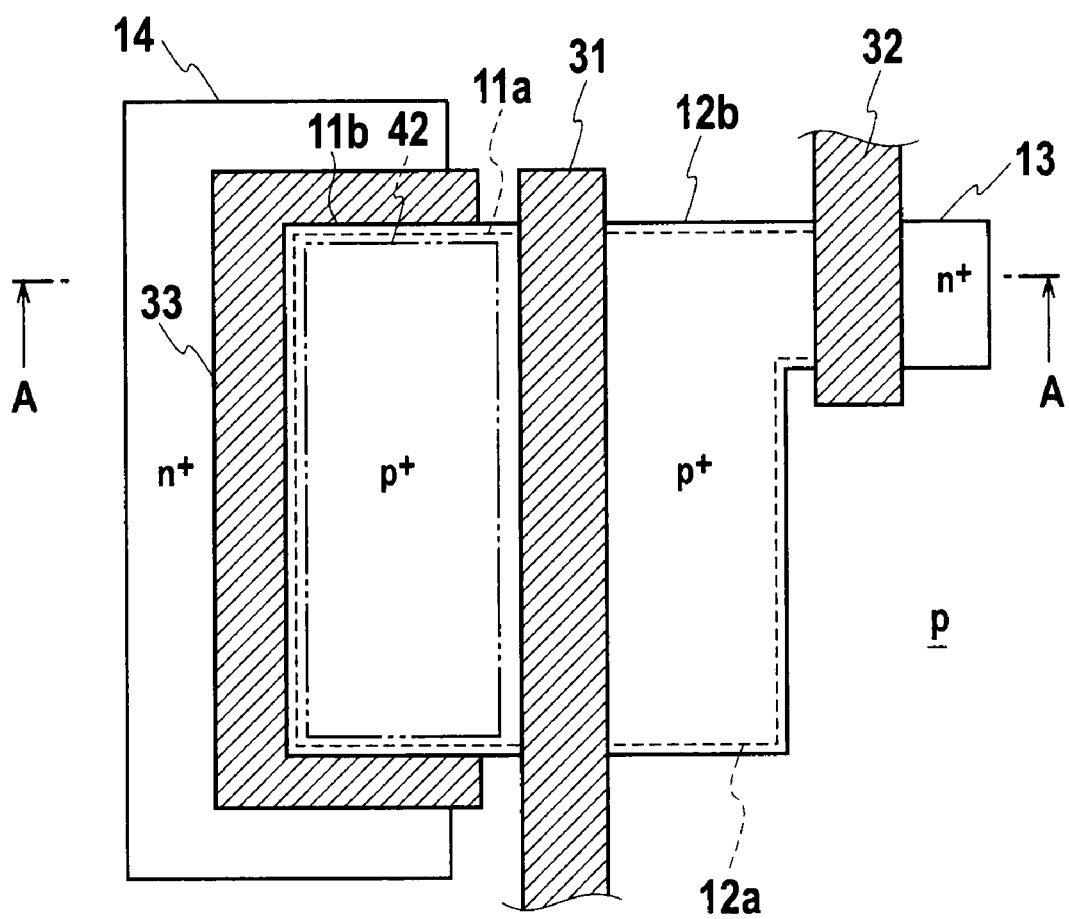
FIG. 2 is a schematic plan view describing a configuration of a semiconductor range-finding element serving as a part of pixels in the solid-state imaging device pertaining to the first embodiment of the present invention.

FIG. 2 shows an example of the planar structure of the semiconductor range-finding element serving as the TOF pixel circuit in each of the pixels $X_{11}$ to $X_{1m}$; $X_{21}$ to $X_{2m}$; . . . ; $X_{n1}$ to $X_{nm}$ in the solid-state imaging device pertaining to the first embodiment, and FIG. 3 (*a*) shows the corresponding cross-sectional view.

Because FIG. 3 (*a*) is the sectional structure when viewed from the A-A plane of the semiconductor range-finding element shown in FIG. 2, FIG. 3 (*a*) is firstly described. As shown in FIG. 3 (*a*), the semiconductor range-finding element encompasses a semiconductor region (semiconductor substrate) 1 of a first conductivity type (p-type), a light receiving surface-buried region (light-receiving cathode region) 11*a* of a second conductivity type (n-type) that is buried in a part of an upper portion of the semiconductor region 1 and receives the reflected light from a target sample 3J as an optical signal and converts the optical signal into signal charges, a charge-accumulation region 12*a* of a second conductivity type ($n^+$-type) that is buried in a part of the upper portion of the semiconductor region 1 and has an impurity concentration higher than the light-receiving cathode region 11*a* and accumulates the signal charges generated in the light-receiving cathode region 11*a*, a charge read-out region 13 for receiving the signal charges accumulated in the charge-accumulation region 12*a*, and a exhausting-drain region 14 for extracting the signal charges generated by the light-receiving cathode region 11*a*. FIG. 3 (*a*) exemplifies the semiconductor substrate of the first conductivity type as "the semiconductor region of first conductivity type". However, instead of the semiconductor substrate 1, it is allowable to employ a silicon epitaxial growth layer of the first conductivity type, having an impurity concentration lower than the semiconductor substrate, grown on the semiconductor substrate of the first conductivity type.

The light-receiving cathode region 11*a* and the semiconductor substrate (anode region) 1 just under the light-receiving cathode region 11*a* implement a photodiode D1. The charge-accumulation region (cathode region) 12*a* and the semiconductor substrate 1 (anode region) just under the charge-accumulation region 12*a* implement a charge accumulating diode D2.

A $p^+$-type pinning layer 11*b* is arranged on the light-receiving cathode region 11*a*. A $p^+$-type pinning layer 12*b* is arranged on the charge-accumulation region 12*a*. Because the $p^+$-type pinning layer 11*b* and the $p^+$-type pinning layer 12*b* serves as the layers for suppressing the generation of carriers on a surface at a dark time, they are preferably used as the layers for dark current reduction. In an application field in which the dark current is not problematic and the like, the $p^+$-type pinning layer 11*b* and the $p^+$-type pinning layer 12*b* may be structurally omitted.

An insulating film 2 is formed on the $p^+$-type pinning layer 11*b* and the $p^+$-type pinning layer 12*b*, on the semiconductor substrate 1 between the $p^+$-type pinning layer 11*b* and the $p^+$-type pinning layer 12*b*, on the semiconductor substrate 1 between the charge-accumulation region 12*a* and the charge read-out region 13, on the semiconductor substrate 1 between the light-receiving cathode 11*a* and the exhausting-drain region 14, on the light-receiving cathode region 11*a* and the charge read-out region 13, on the light-receiving cathode region 11*a* and on the exhausting-drain region 14. As the insulating film 2, a silicon oxide film ($SiO_2$ film) is preferable. However, various insulated-gate structures in insulated-gate transistors (MIS transistors), in which various insulating films other than the silicon oxide film ($SiO_2$ film) are used, may be available. For example, the ONO film implemented by the triple-layer laminated film of silicon oxide film ($SiO_2$ film)/silicon nitride film ($Si_3N_4$ film)/silicon oxide film ($SiO_2$ film) may be used. Moreover, the oxide that includes at least one element of strontium (Sr), aluminum (Al), magnesium (Mg), yttrium (Y), hafnium (Hf), zirconium (Zr), tantalum (Ta) and bismuth (Bi), or the silicon nitride that includes those elements, or the like can be used as the insulating film 2.

On the insulating film 2, a transfer-gate electrode 31 that controls the potential of a first transfer-channel defined on the surface (upper portion) of the semiconductor substrate 1 is arranged between the light-receiving cathode region 11*a* and the charge-accumulation region 12*a* so as to transfer the signal charges from the light-receiving cathode region 11*a* to the charge-accumulation region 12*a*, and a first potential control means is established by the transfer-gate electrode 31, the insulating film 2, and first transfer-channel. Moreover, on the insulating film 2, a read-out gate electrode 32 that controls the potential of a second transfer-channel defined on the surface (upper portion) of the semiconductor substrate 1 is arranged between the charge-accumulation region 12*a* and the charge read-out region 13 so as to transfer the signal charges from the charge-accumulation region 12*a* to the charge read-out region 13, and a second potential control means is established by the read-out gate electrode 32, the insulating film 2 and the second transfer-channel. Moreover, on the insulating film 2, an exhaust-gate electrode 33 that controls the potential of a third transfer-channel defined on the surface (upper portion) of the semiconductor substrate 1 is arranged between the light-receiving cathode region 11*a* and the exhausting-drain region 14 so as to remove the signal charges from the light-receiving cathode region 11*a* to the exhausting-drain region 14, and a third potential control means is established by the exhaust-gate electrode 33, the insulating film 2 and the third transfer-channel.

The plan view in FIG. 2 shows the rectangular $p^+$-type pinning layer 11*b* arranged on the light-receiving cathode region 11*a*, as understood from FIG. 3 (*a*), and the light-receiving cathode region 11*a* is also rectangular as the planar pattern. The transfer-gate electrode 31 extends over the portion between the light-receiving cathode region 11*a* and the $p^+$-type pinning layer 12*b* arranged on the charge-accumulation region 12*a*. Below the $p^+$-type pinning layer 12*b*, there is the charge-accumulation region 12*a* in the planar pattern substantially similar to the $p^+$-type pinning layer 12*b*. Moreover, the read-out gate electrode 32 extends over the portion between the $p^+$-type pinning layer 12*b* and the $n^+$-type charge read-out region 13. Moreover, the exhaust-gate electrode 33 extends over the portion between the $p^+$-type pinning layer 11*b* and the exhausting-drain region 14.

The light emitted as a repetitive pulse signal from a light source 101 shown in FIG. 1 is reflected by a target sample 102 and enters through a lens 103 into the respective pixels $X_{11}$ to $X_{1m}$; $X_{21}$ to $X_{2m}$; . . . ; $X_{n1}$ to $X_{nm}$. That is, as shown in FIG. 2, the reflected light pulses enter through an opening 42 of a light shielding film 41 into each of the pixels $X_{11}$ to $X_{1m}$; $X_{21}$ to $X_{2m}$; . . . ; $X_{n1}$ to $X_{nm}$ to the photodiode D1 of each of the pixels $X_{11}$ to $X_{1m}$; $X_{21}$ to $X_{2m}$; . . . ; $X_{n1}$ to $X_{nm}$. The photodiode D1 receives the light pulses, which are entered through the opening 42 of the light shielding film, as optical signals, and converts the optical signals into the signal charges.

FIG. 3 (*b*) is the potential diagram on the cross-section by which the light-receiving cathode region 11*a*, the charge-accumulation region 12*a* and the charge read-out region 13 are cut along the P-P plane indicated by a chain-dotted line in FIG. 3 (*a*), and the charges (electrons) are indicated by a filled circles. The left side of FIG. 3 (*a*) shows a potential well (first potential well) PW1 representing a conduction band edge of the light-receiving cathode region 11*a*. Moreover, a potential well (second potential well) PW2 representing the conduction band edge of the charge-accumulation region 12*a* is indicated on the right side of the first potential well PW1. The potential barrier between the first potential well PW1 and the second potential well PW2 corresponds to the potential profile of the conduction band edge of the semiconductor substrate 1 just under the transfer-gate electrode 31. Moreover, on the right side of the second potential well PW2, the potential well of the charge read-out region 13 is indicated by diagonal hatch with upward oblique lines to the right. The potential barrier between the second potential well PW2 and the potential well of the charge read-out region 13 corresponds to the potential profile of the conduction band edge of the semiconductor substrate 1 just under the read-out gate electrode 32. Here, since the impurity concentration of the charge-accumulation region 12a is higher than the impurity concentration of the light-receiving cathode region 11a, the depth of the second potential well PW2 is deeper than the depth of the first potential well PW1.

As shown in FIG. 3 (b), when a low voltage (0 V or a negative voltage) as a control signal GS is applied to the transfer-gate electrode 31, the potential barrier against the electron is formed between the first potential well PW1 and the second potential well PW2 so that the signal charges are not transferred from the light-receiving cathode region 11a to the charge-accumulation region 12a.

As shown in FIG. 4 (a), when a high voltage (positive voltage) as the control signal GS is applied to the transfer-gate electrode 31, the height of the potential barrier between the light-receiving cathode region 11a and the charge-accumulation region 12a is decreased or extinguished, and the signal charges are transferred from the light-receiving cathode region 11a to the charge-accumulation region 12a. As mentioned above, since the depth of the second potential well PW2 is set to be deeper than the depth of the first potential well PW1, it is possible to achieve the perfect transfer in which all of the signal charges are transferred to the charge-accumulation region 12a from the light-receiving cathode region 11a. The perfect transfer enables the protection of an afterimage and enables the protection of the generation of the random noise caused by the remnant charges.

As shown in FIG. 4 (b), when a high voltage (positive voltage) as a control signal CD is applied to the exhaust-gate electrode 33, the height of the potential barrier against the electrons between the light-receiving cathode region 11a and the exhausting-drain region 14 is decreased or extinguished, and the signal charges are extracted from the light-receiving cathode region 11a to the exhausting-drain region 14.

As shown in FIG. 4 (c), when a high voltage (positive voltage) as a control signal TS is applied to the read-out gate electrode 32, the height of the potential barrier between the charge-accumulation region 12a and the charge read-out region 13 is decreased or extinguished, and the signal charges are transferred from the charge-accumulation region 12a to the charge read-out region 13.

In this way, without retaining the signal charges in the light-receiving cathode region 11a and the charge-accumulation region 12a, the exhaust-gate electrode 35 and the transfer-gate electrode 31 can control the flow direction of the signal charges. Thus, since the signal charges are not required to be retained in the light-receiving cathode region 11a and the charge-accumulation region 12a, the depths of the potentials of the light-receiving cathode region 11a and the charge-accumulation region 12a may be made shallow. Hence, it is easy to manufacture the structure in which the signal charges are transferred at a high speed.

As shown in FIG. 3 (a), the gate electrode of a signal read-out transistor (amplifying transistor) $MA_1$ implementing a read-out buffer amplifier 108 is connected to the charge read-out region 13. The drain electrode of the signal read-out transistor (amplifying transistor) $MA_1$ is connected to a power supply VDD, and the source electrode is connected to the drain electrode of a switching transistor $MS_1$ for selecting a subject pixel. The source electrode of the switching transistor $MS_1$ for selecting the subject pixel is connected to a vertical signal line $B_1$, and a control signal S for selecting a horizontal line is applied to the gate electrode from the vertical shift register 105. When the select-control signal S is set to a high (H) level, the switching transistor $MS_1$ is turned on, and the current, which is amplified by the signal read-out transistor (amplifying transistor) $MA_1$ and corresponds to the potential of the charge read-out region 13, flows into the vertical signal line $B_1$. Moreover, the source electrode of a reset transistor $T_R$ implementing the read-out buffer amplifier 108 is connected to the charge read-out region 13. The drain electrode of the reset transistor $T_R$ is connected to the power supply VDD, and a reset signal R is configured to be applied to the gate electrode. When the reset signal is set to the high (H) level, the signal charges stored in the light-receiving cathode region 11a and the charge-accumulation region 12a are extracted, and the light-receiving cathode region 11a and the charge-accumulation region 12a are reset.

The semiconductor substrate 1 preferably has an impurity concentration of about $5 \times 10^{12}$ cm$^{-3}$ or more and about $5 \times 10^{16}$ cm$^{-3}$ or less. In particular, when the semiconductor substrate 1 is assumed to be a silicon substrate having an impurity concentration of about $4 \times 10^{14}$ cm$^{-3}$ or more and about $3 \times 10^{16}$ cm$^{-3}$ or less, a standard CMOS process can be employed. As the insulating film 2, it is possible to use the insulating film (field oxide film) fabricated by a selective-oxidization method, which is referred to as "a local oxidation of silicon (LOCOS) method" used for element isolation.

As the impurity concentration of the light-receiving cathode region 11a, it is possible to employ a value, with which the depletion of mobile carriers in full thickness of the light-receiving cathode region 11a is relatively easy, such as a value between about $1 \times 10^{17}$ cm$^{-3}$ and about $8 \times 10^{18}$ cm$^{-3}$, preferably, a value between about $2 \times 10^{17}$ cm$^{-3}$ and about $1 \times 10^{18}$ cm$^{-3}$, typically, for example, a value of about $8 \times 10^{17}$ cm$^{-3}$, while the thickness of the light-receiving cathode region 11a can be set to about 0.1 to 3 micrometers, preferably about 0.5 to 1.5 micrometers. On the other hand, as the impurity concentration of the charge-accumulation region 12a, it is possible to employ a value between about $1 \times 10^{19}$ cm$^{-3}$ and about $1 \times 10^{21}$ cm$^{-3}$, preferably, a value between about $2 \times 10^{19}$ cm$^{-3}$ and about $5 \times 10^{20}$ cm$^{-3}$, typically, for example, a value of about $3 \times 10^{19}$ cm$^{-3}$, and the thickness of the charge-accumulation region 12a can be designed to be about 0.1 to 3 micrometers, preferably, about 0.5 to 1.5 micrometers. The impurity concentration of the charge-accumulation region 12a may be elected to be about five to 1000 times the impurity concentration of the light-receiving cathode region 11a, preferably, about ten to 300 times.

When the insulating film 2 is made of the thermal oxide film, the thickness of the thermal oxide film may be set to about 150 nm or more and about 1000 nm or less, preferably, about 200 nm or more and 400 nm or less. When an insulating film 2 is made of a dielectric film other than the thermal oxide film, an equivalent thickness converted with respect to the relative dielectric constant $\in_r$ of the thermal oxide film shall be used (at 1 MHz, $\in_r$=3.8). For example, when a CVD oxide film having a relative dielectric constant $\in_r$=4.4 is used, an equivalent thickness in which the foregoing thickness of the thermal oxide film is multiplied by 1.16 (=4.4/3.8) may be employed, and when a silicon nitride ($Si_3N_4$) film having a relative dielectric constant $\in_r$=7 is used, an equivalent thickness in which the foregoing thickness of the thermal oxide film is multiplied by 1.84 (=7/3.8) may be employed. However, the oxide film ($SiO_2$ film) produced by the standard CMOS technique is preferred to be used, and the use of the field oxide film in the CMOS technique is suitable for the simplification of the manufacturing steps.

As shown in FIG. 3 (a), an opening 42 is selectively cut in the light shielding film 41 so that the photo-generated charges can be generated in the semiconductor substrate 1 just under the light-receiving cathode region 11a implementing the photodiode D1. Although FIG. 3 (a) shows only a single insulating film 2, the light shielding film 41 may be implemented by a metallic thin film, such as aluminum (Al) and the like, formed on any one of a plurality of inter-layer insulating films, establishing a multilevel wiring structure (not shown).

<Operation of Solid-State Imaging Device>

Figure 5:
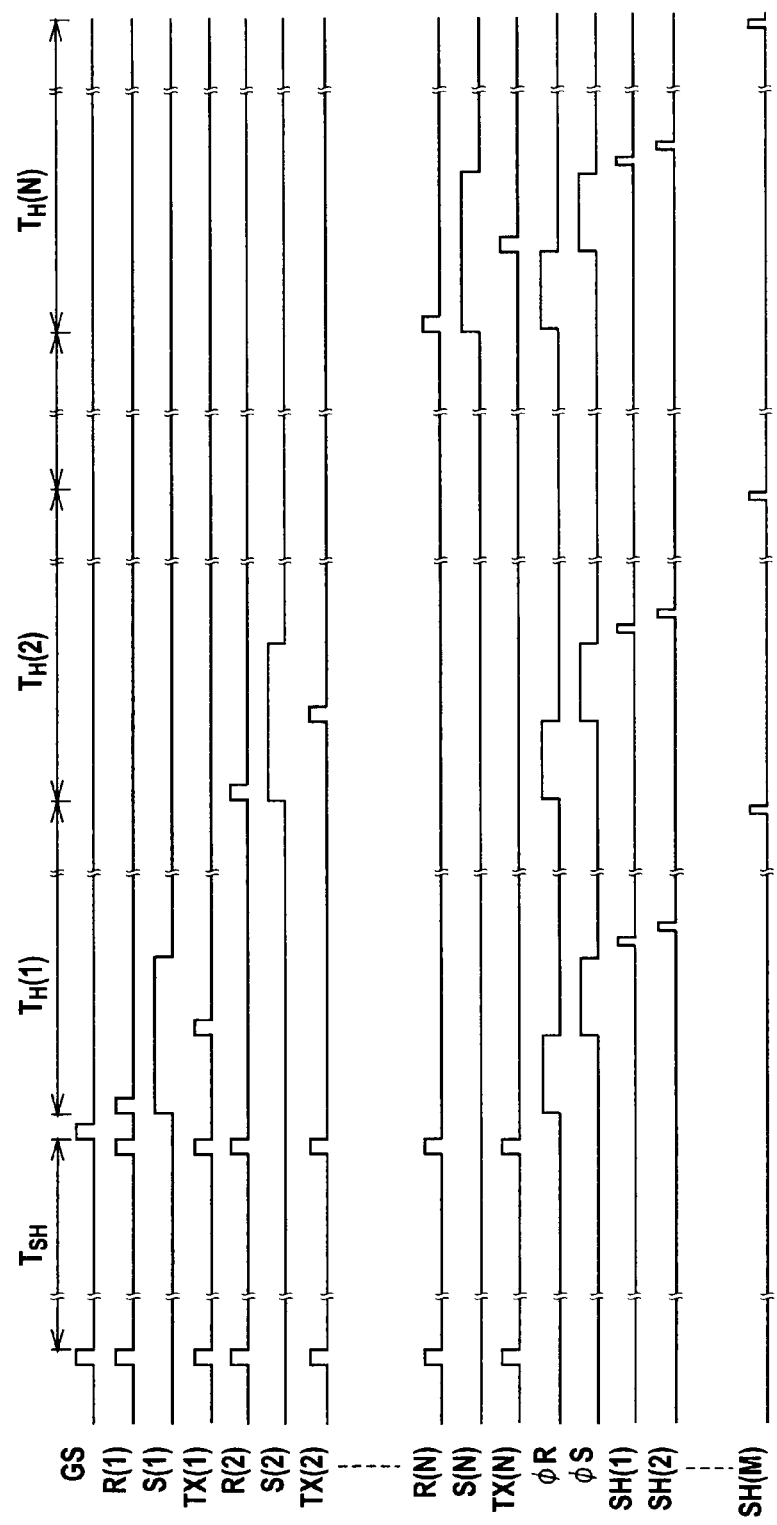
FIG. 5 is a timing chart describing the operations of the solid-state imaging device pertaining to the first embodiment of the present invention.

An operation of the solid-state imaging device (two-dimensional image sensor), whose schematic configuration is shown in FIG. 1, pertaining to the first embodiment of the present invention, is described by using the timing chart shown in FIG. 5.

(a) At first, prior to an electronic-shutter duration $T_{SH}$, the pulses of the control signal GS, the control signals TX(1) to TX(N) and the reset signals R(1) to R(N) are applied to each of the pixels $X_{11}$ to $X_{1m}$; $X_{21}$ to $X_{2m}$; . . . ; $X_{n1}$ to $X_{nm}$ shown in FIG. 1. Then, the signal charges of the light-receiving cathode region 11a and the charge-accumulation region 12a are extracted at the same time, and the light-receiving cathode region 11a and the charge-accumulation region 12a are reset.

(b) After resetting, in the electronic-shutter duration $T_{SH}$, the light source 101 emits the light pulses. Then, the light pulses reflected by the target sample 102 are entered to each of the light-receiving cathode regions 11a through the opening 42 of the light shielding film 41 into each of the pixels $X_{11}$ to $X_{1m}$; $X_{21}$ to $X_{2m}$; . . . ; $X_{n1}$ to $X_{nm}$. The light-receiving cathode region 11a accumulates the signal charges generated by the input light pulses. By the way, the electronic-shutter duration $T_{SH}$ can be arbitrarily determined.

(c) At the time of the completion of the electronic-shutter duration $T_{SH}$, the pulses of the control signals TX(1) to TX(N) and the reset signals are applied to each of all the pixels $X_{11}$ to $X_{1m}$; $X_{21}$ to $X_{2m}$; . . . ; $X_{n1}$ to $X_{nm}$ simultaneously at the timing as shown in FIG. 5 so that, the unnecessary charges generated by stray light leaked into the charge-accumulation region 12a and the like can be extracted from all the pixels. However, the extraction of the unnecessary electrons caused by the leaked light and the like can be omitted.

(d) After the completion of the electronic-shutter duration $T_{SH}$, in all the pixels $X_{11}$ to $X_{1m}$; $X_{21}$ to $X_{2m}$; . . . ; $X_{n1}$ to $X_{nm}$, the control signal GS is applied, and the signal charges are transferred from the light-receiving cathode region 11a to the charge-accumulation region 12a.

(e) After that, in each of signal read-out durations $T_{H(1)}$, $T_{H(2)}$, . . . $T_{H(N)}$, the reading out of the pixel signal corresponding to a subject single row elected by the output of the vertical shift register is executed, in synchronization with each of the charge transfers in the pixels. That is, for each horizontal line, the potential levels dependent on the stored signal charges in the charge read-out region 13 are read out to each of noise canceling circuits $NC_1$ to $NC_m$ of the corresponding row. After the noise canceling is executed in each of the noise canceling circuits $NC_1$ to $NC_m$, a horizontal scanning is executed. Namely, at first, the pulse of the reset signal R(1) is applied to the first horizontal line in the signal read-out durations $T_{H(1)}$ so that the reset level when the charge read-out region 13 is reset can be sampled and stored in a capacitor C1 inside the noise canceling circuit $NC_1$ through a pulse φR. Next, the control signal TX(1) is applied to the first horizontal line in the signal read-out durations $T_{H(1)}$ so that the signal charges are transferred from the light-receiving cathode region 11a through the charge-accumulation region 12a to the charge read-out region 13. The signal level, when the control signal TX(1) is applied, is sampled and stored in another capacitor C2 in the noise canceling circuit $NC_1$ through a pulse φS. The above operation is performed on every pixel on the first row (horizontal line) at the same time, and the signals of the first row are stored in the noise canceling circuits $NC_1$ to $NC_m$. Then, the signals stored in the noise canceling circuits $NC_1$ to $NC_m$ are sequentially read out by applying horizontal selection control signals SH(1) to SH(M) to the noise canceling circuits $NC_1$ to $NC_m$, respectively, and the sequentially read out signals are fed to a differential amplifier 107. Since the differential amplifier 107 determines the difference between the reset levels and the signal levels stored in the noise canceling circuits $NC_1$ to $NC_m$, the fixed pattern noise generated by the amplifying transistor and the like and the reset noise generated in a floating diffusion layer are cancelled. The picture signals from the differential amplifier 107 are sequentially read out to the outside by the horizontal scanning. Since such a process is performed from the first row to the final row, all of the picture signals are read out. The selection of one horizontal line is carried out by applying the control signal S to the switching transistors $MS_1$ for pixel selections in the voltage read-out buffer amplifiers 108 inside the pixels $X_{11}$ to $X_{1m}$; $X_{21}$ to $X_{2m}$; . . . ; $X_{n1}$ to $X_{nm}$. Then, the signal of the horizontal line corresponding to the vertical signal appears.

<Method for Obtaining Range Image by Using Time-of-Flight>

Figure 6:
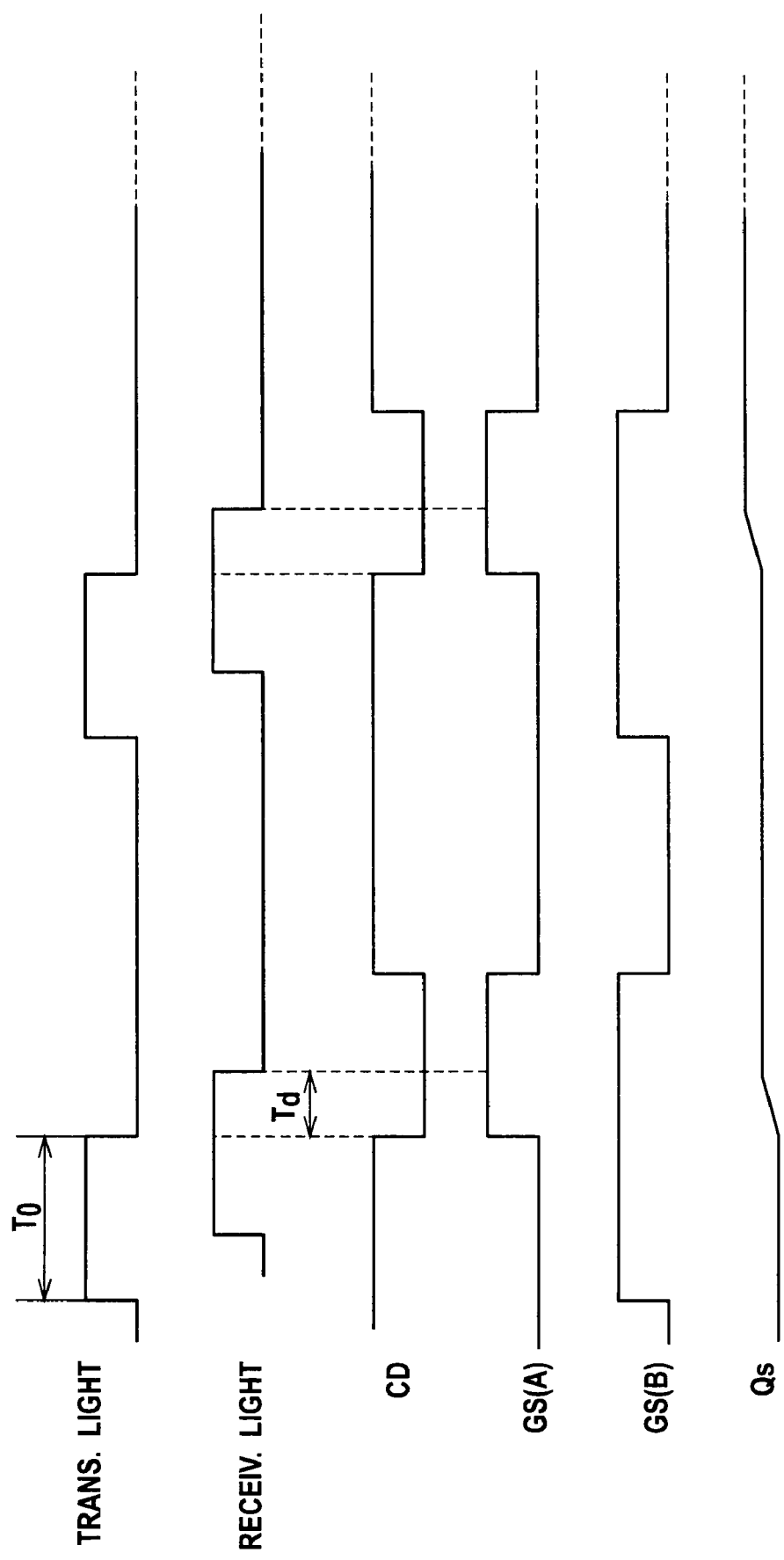
FIG. 6 is a timing chart describing a TOF measuring method pertaining to the first embodiment of the present invention.

As an example of the application of the solid-state imaging device (two-dimensional image sensor) pertaining to the first embodiment of the present invention, a method for obtaining a range image using a time-of-flight will be described below using the timing chart shown in FIG. 6. As shown in FIG. 6, a repetitive-light pulses source is used to emit the light pulses (transmitted light) to the target sample. Then, when reflected light pulses (received light) by the target sample are caught by each pixel, each of delay time $T_d$ of the reflected light pulses is changed, depending on the ranges to the target sample.

(a) Here, the range image is obtained by dividing into a first repetition period and a second repetition period. For example, "first repetition period" may be defined as the period of odd-numbered frames, and "second repetition period" may be defined as the period of even-numbered frames. In the first repetition period (odd-numbered frames), pulses of control signal GS(A) are applied to the transfer-gate electrode (first potential D control means) 31 immediately after the pulses of the transmitted light, and the signal charges are transferred from the light-receiving cathode region 11a to the charge-accumulation region 12a. Therefore, the signal charges corresponding to a part of the received light, or the light received in a period of the delay time $T_d$, are repeatedly transferred by the transfer-gate electrode (first potential control means) 31. After that, a control signal TX is applied to the read-out gate electrode (second potential control means) 32 so that signal charges accumulated in the charge-accumulation region 12a can be read out by the read-out gate electrode (second potential control means) 32.

(b) Moreover, in the first repetition period (odd-numbered frames), pulses of control signal CD(A) having a phase opposite to the control signal GS(A) are applied to the exhaust-gate electrode (third potential control means) 33, so that, when the signal charges are not transferred from the light-receiving cathode region 11a to the charge-accumulation region 12a, the signal charges are extracted from the light-receiving cathode region 11a to the exhausting-drain region 14 by the exhaust-gate electrode (third potential control means) 33.

(c) In the second repetition period (even-numbered frames), simultaneously with the leading edge of the pulse of the light (transmitted light), the pulse of the control signal GS(B) starts to rise so that the control signal GS(B) can be applied to the transfer-gate electrode (first potential control means) 31. Then, in a constant time interval longer than a pulse width $T_o$ of the light (transmitted light), the signal charges are repeatedly transferred from the light-receiving cathode region 11a to the charge-accumulation region 12a. Therefore, the signal charges resulting from the entire received light are always accumulated in the charge-accumulation region 12a. After that, the control signal TX is applied to the read-out gate electrode (second potential control means) 32, and the signal charges accumulated in the charge-accumulation region 12a are read out by the read-out gate electrode (second potential control means) 32.

(d) Alternatively, although the illustration is omitted, in the second repetition period (even-numbered frames), a control signal CD(B) having a phase opposite to the control signal GS(B) may be applied to the exhaust-gate electrode (third potential control means) 33 so that, when signal charges are not transferred from the light-receiving cathode region 11a to the charge-accumulation region 12a, signal charges can be extracted from the light-receiving cathode region 11a to the charge-accumulation region 12a.

In the first repetition period (odd-numbered frames), signal charges (first signal charges) $Q_{s1}$ which are transferred from the light-receiving cathode region 11a to the charge-accumulation region 12a are represented by Eq. (1), with the repetition number N of the optical pulses and the optical current $I_{ph}$ in the first repetition period (odd-numbered frames):

$$Q_{s1} = I_{ph} \times T_d \times N \quad (1)$$

In the second repetition period (even-numbered frames), signal charges (second signal charges) $Q_{s2}$ which are transferred from the light-receiving cathode region 11a to the charge-accumulation region 12a is represented by Eq. (2), with the repetition number N of the optical pulse and the optical current $I_{ph}$ in the second repetition period (even-numbered frames):

$$Q_{s2} = I_{ph} \times T_o \times N \quad (2)$$

From the Eq. (1) and the Eq. (2), the delay time $T_d$ can be calculated by Eq. (3).

$$T_d = T_o \times (Q_{s1}/Q_{s2}) \quad (3)$$

A distance D to the target sample is calculated by Eq. (4), with light velocity c.

$$D = (c/2) \times T_d = (c/2) \times T_o \times (Q_{s1}/Q_{s2}) \quad (4)$$

Thus, it is possible to measure a distance D to a target sample, by calculating the ratio between the total quantities of the signal charges $Q_{s1}$ accumulated in the charge-accumulation region 12a in the first repetition period (odd-numbered frames) and the signal charges $Q_{s2}$ accumulated in the charge-accumulation region 12a in the second repetition period (even-numbered frames).

According to the semiconductor range-finding element and the solid-state imaging device (two-dimensional image sensor) pertaining to the first embodiment of the present invention, because the manufacturing cost of the solid-state imaging device having a high range resolution is low, with a simple structure, a TOF range-finding sensor in which the large number of the pixels are arranged so as to achieve a high space resolution can be provided.

<Method for Manufacturing Semiconductor Range-Finding Element and Solid-State Imaging Device>

Figure 9:
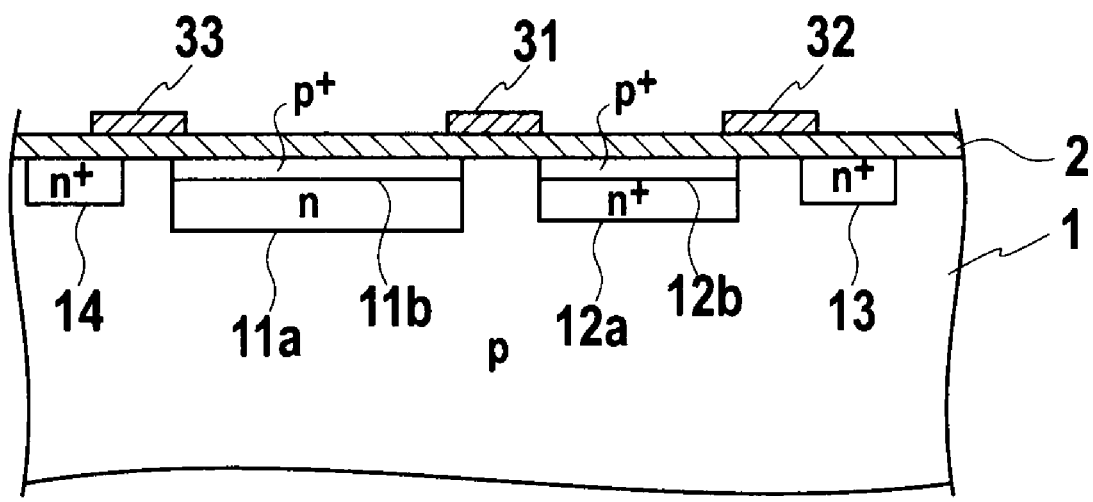
FIG. 9 is a schematic plan view describing a configuration of a semiconductor range-finding element that serves as a part of pixels of a solid-state imaging device according to a modification of the first embodiment of the present invention.

A method for manufacturing the semiconductor range-finding element and the solid-state imaging device pertaining to the first embodiment of the present invention will be described below by using FIG. 7 (a) to FIG. 9. By the way, the method for manufacturing the semiconductor range-finding element and the solid-state imaging device, which will be described as follows, is merely an example. Then, the semiconductor range-finding element and the solid-state imaging device pertaining to the first embodiment can be naturally manufactured by using various manufacturing methods other than the following method, including modifications.

(a) At first, although the illustration is omitted, a p-type semiconductor substrate whose main surface is a (100) plane of about 30 to 0.65 Ωcm (the impurity concentration is between about $4 \times 10^{14}$ cm$^{-3}$ and about $3 \times 10^{16}$ cm$^{-3}$) is prepared. After a thermal oxide film (SiO$_2$ film) having a thickness of about 150 nm is formed on the main surface of the p-type semiconductor substrate, a photoresist film is coated, and the photoresist film is delineated by a photolithography technique so as to open a p-well formation region in the photoresist film. Next, boron ($^{11}$B$^+$) ions at a dose of about $10^{12}$ to $10^{13}$ cm$^{-2}$ are implanted through the thermal oxide film into the p-well formation region. Next, the thermal oxide film located at the portion of the well formation region is etched and removed. Also, after the photoresist film is removed and a predetermined cleaning step is completed, the implanted boron ions are thermally diffused at about 1200° C. so as to form a p-well. Simultaneously, other p-wells are also formed in the peripheral circuit area and the read-out buffer amplifier 108 arranged in each pixel $X_{ij}$. Also, n-wells are similarly formed on the peripheral circuit area. Moreover, after all of the thermal oxide films on the main surface of the p-type semiconductor substrate are removed and stripped, a pad oxide film (SiO$_2$ film) having a film thickness of about 100 nm is again formed on the main surface of the semiconductor substrate thermal oxidizing method. After that, CVD method is used to grow a nitride film (Si$_3$N$_4$ film) having a film thickness of about 200 nm. The photoresist film delineated by photolithography technique is formed on the nitride film, and with the delineated photoresist film as a mask, reactive ion etching (RIE) is performed, and a mask of the nitride film for the selective oxidization (LOCOS) is formed. Then, the LOCOS method is used to form a field oxide film having a thickness between about 150 nm and about 1000 nm, alternatively between about 200 nm and about 400 nm, on an opening of the nitride film. The nitride film covering the element formation region is used as the oxidization protection film, because the oxidization rate of the nitride film is very low as compared with silicon.

(b) Next, although the illustration is omitted, after the removal of the nitride film, a dummy oxide film having a film thickness of several 10 nm is formed on the element formation region. Next, a gate-threshold voltage control (Vth-control) ion-implantation is performed. At first, by photolithography technique, the p-well in the peripheral circuit is covered with a photoresist film, and the impurity ions for the gate-threshold voltage control of pMOS are implanted. Next, after the removal of the photoresist film, the pattern of another photoresist film is formed on the region except the p-well, by photolithography technique. In succession, the impurity ions for the gate-threshold voltage control of nMOS are implanted into the p-wells of the peripheral circuit and the read-out buffer amplifier 108, simultaneously. After that, the photoresist film is removed. Further, the dummy oxide film used as the buffering film for the Vth-control ion implantation is stripped.

(c) Next, the surface of the semiconductor substrate 1 is thermally oxidized to form a gate oxide film 2, as shown in FIG. 7 (a). Moreover, a poly-silicon film 3 is deposited at about 200 to 400 nm on the entire surface of the gate oxide film 2, by CVD method. Then, a photoresist film 51 delineated by photolithography technique is formed on the poly-silicon film 3, as shown in FIG. 7 (b). Then, with the delineated photoresist film 51 as the mask, the poly-silicon film 3 is etched by RIE and the like. After that, when the photoresist film 51 is removed, as shown in FIG. 7 (c), the patterns of the transfer-gate electrode 31, the read-out gate electrode 32 and the exhaust-gate electrode 33 are cut.

(d) Next, by using photolithography technique, the semiconductor substrate 1 is covered with a photoresist film 52. Then, as shown in FIG. 8 (a), using the transfer-gate electrode 31, the read-out gate electrode 32 and the exhaust-gate electrode 33 as masks, and phosphorous ($^{31}P^+$) ions are implanted at a dose of an order of about $10^{15}$ cm$^{-2}$ into the semiconductor substrate 1 in a self-alignment manner. Simultaneously, the ion-implantations are similarly performed on the p-wells of the peripheral circuit and the read-out buffer amplifier 108, in the self-alignment manner with the poly-silicon gate electrode as the mask. Simultaneously, the phosphorous ($^{31}P^+$) is also ion-implanted into the transfer-gate electrode 31, the read-out gate electrode 32 and the exhaust-gate electrode 33, which are made of poly-silicon, and the poly-silicon gate electrode on the p-well of the peripheral circuit (not shown), and the like. After that, the photoresist film 52 is removed.

(e) Next, by using photolithography technique, the semiconductor substrate 1 is covered with another photoresist film 53. Then, as shown in FIG. 8(b), the transfer-gate electrode 31, the read-out gate electrode 32 and the exhaust-gate electrode 33 are used as the masks, and in the self-alignment manner, arsenic ($^{75}As^+$) ions are implanted at a dose of an order of between $8\times10^{15}$ and $5\times10^{16}$ cm$^{-2}$ into the semiconductor substrate 1. Simultaneously, in accordance with necessity, the ion-implantation is similarly performed on the p-wells of the peripheral circuit and the voltage read-out buffer amplifier 108, with poly-silicon gate electrodes as the mask. Simultaneously, the arsenic ($^{75}As^+$) ions are implanted into the transfer-gate electrode 31, the read-out gate electrode 32 and the exhaust-gate electrode 33, which are made of poly-silicon, and poly-silicon gate electrodes on the p-well of the peripheral circuit (not shown), and the like. After that, the photoresist film 53 is removed.

(f) Next, by using photolithography technique, the semiconductor substrate 1 is covered with another photoresist film 54. Then, as shown in FIG. 8(c), the transfer-gate electrode 31, the read-out gate electrode 32 and the exhaust-gate electrode 33 are used as the masks, and in the self-alignment manner, boron ($^{11}B^+$) ions are implanted at a dose of an order of between $3\times10^{15}$ and $1\times10^{16}$ cm$^{-2}$ into the semiconductor substrate 1. Simultaneously, in accordance with necessity, another ion-implantation is similarly performed on the n-wells of the peripheral circuit and the voltage read-out buffer amplifier 108, in the self-alignment manner, with the poly-silicon gate electrode as the mask. Then, the boron ($^{11}B^+$) ions are implanted into the transfer-gate electrode 31, the read-out gate electrode 32 and the exhaust-gate electrode 33, which are made of poly-silicon, and the poly-silicon gate electrodes on the p-well of the peripheral circuit (not shown), and the like. After that, when the photoresist film 54 is removed and an activation anneal is performed on the semiconductor substrate 1, the n-type light-receiving cathode region 11a, the p$^+$-type pinning layer 11b, the n$^+$-type charge-accumulation region 12a whose impurity concentration is higher than the light-receiving cathode region 11a, the p$^+$-type pinning layer 12b, the n$^+$-type charge read-out region 13, and the exhausting-drain region 14 are formed in the semiconductor region 1, as shown in FIG. 9. By the activation anneal, n-type source/drain regions are formed similarly in the p-well of the peripheral circuit (not shown) and the like. In the activation anneal, phosphorous ($^{31}P^+$) ions, arsenic ($^{75}As^+$) ions and boron ($^{11}B^+$) ions, which are implanted into the transfer-gate electrode 31, the read-out gate electrode 32 and the exhaust-gate electrode 33 are also activated so as to reduce the resistances of the transfer-gate electrode 31, the read-out gate electrode 32 and the exhaust-gate electrode 33.

(g) Next, although the illustration is omitted, inter-layer insulating films are deposited, in order to insulate the vertical signal lines and horizontal scanning lines configured to connect the respective pixels, or the metallic wiring layers for the connection between the respective transistors in the peripheral circuit, or the portion between the poly-silicon films implementing the gate electrodes. As the inter-layer insulating film, it is possible to use the various dielectric films, such as the composite film implemented by double-layer structure of. . . an oxide film (CVD-SiO$_2$) deposited by CVD method, having a film thickness of about 0.5 micrometers; and a PSG film or a BPSG film deposited on the oxide film (CVD-SiO$_2$) by CVD method, having a film thickness of about 0.5 micrometers. After the deposition by CVD method, the double-layer structure is annealed. Thus, the BPSG film in the upper layer of the composite film is reflowed, and the surface of the inter-layer insulating film is made flat. On the surface of the inter-layer insulating film, the photoresist film delineated by photolithography technique is formed so as to serve as an etching mask, and the inter-layer insulating film is etched by RIE or ECR ion-etching and the like, and contact holes to connect the metallic wiring layer and the transistor are cut. After that, the photoresist film used to cut the contact holes is removed. Next, a sputtering method or an electron beam vacuum evaporation method or the like is used to form aluminum alloy (Al—Si, Al—Cu—Si and the like) films. Thereon, using photolithography technique to delineate a mask of a photoresist film, the aluminum alloy film is defined by RIE with the delineated mask. Such series of processes are sequentially repeated. Consequently, the vertical signal lines and horizontal scanning lines to connect the respective pixels, or the metallic wiring layers for the connections between the respective transistors in the peripheral circuit are formed. Moreover, another inter-layer insulating film is deposited on the metallic wiring layers, and further a metallic film having openings 42 just on each of the semiconductor regions of pixels is formed by photolithography technique, so that the metallic film is defined as a light shielding film 41. Then, when a passivation film having a film thickness of about one micrometer, which is intended to protect the mechanical damage and protect the immersion of the water and the impurities, is laminated on the light shielding film by CVD method, the solid-state imaging device pertaining to the first embodiment of the present invention is completed. The PSG film, the nitride film and the like are used as the passivation film.

As described above, according to the method for manufacturing the semiconductor range-finding element and the solid-state imaging device pertaining to the first embodiment of the present invention, formations of the light-receiving cathode region 11a, the p$^+$-type pinning layer 11b, the charge-accumulation region 12a, the p$^+$-type semiconductor region 12b and the charge read-out region 13 can be established only by adding a simple step, such as the ion-implantation and the like, as an additional step shown in FIG. 8 (b) to the standard process of CMOS image sensor. Thus, based upon the standard CMOS process, similarly to the CCD, the TOF range-finding sensor, which facilitated a high-speed signal transfer, can be provided.

<Modification of First Embodiment>

In the solid-state imaging device pertaining to the modification of the first embodiment, as a planar structure of the semiconductor range-finding element, which is arranged in each of the pixels $X_{11}$ to $X_{1m}$; $X_{21}$ to $X_{2m}$; ... ; $X_{n1}$ to $X_{nm}$, as shown in FIG. 10(a), a plurality of band-shaped (stripe-shaped) patterns of the $n^+$-type light-receiving cathode regions 11a may be formed. FIG. 10 (b) shows a cross-sectional structure viewed from the B-B plane in FIG. 10 (a). The $p^+$-type pinning layer 11b may exhibit a plurality of striped patterns similarly to the light-receiving cathode region 11a, or alternatively, may exhibit a continuous pattern.

Instead of the configuration in which the charge-accumulation region 12a and the light-receiving cathode region 11a differ in impurity concentration, because the planar pattern of the light-receiving cathode region 11a is divided into thin strips, only the side of the light-receiving cathode regions 11a can be easily depleted. That is, the bottom level of the first potential well PW1 (the potential when the light-receiving cathode regions 11a are depleted) can be effectively made higher than the bottom level of the second potential well PW2, thereby enabling the signal charges to be perfectly transferred.

In the modification of the first embodiment, since the impurity concentrations of the light-receiving cathode region 11a and the charge-accumulation region 12a could be made equal so that the additional step shown in FIG. 8 (b) can be eliminated, the method for manufacturing the semiconductor range-finding element and the solid-state imaging device can be simplified.

Second Embodiment

Figure 11:
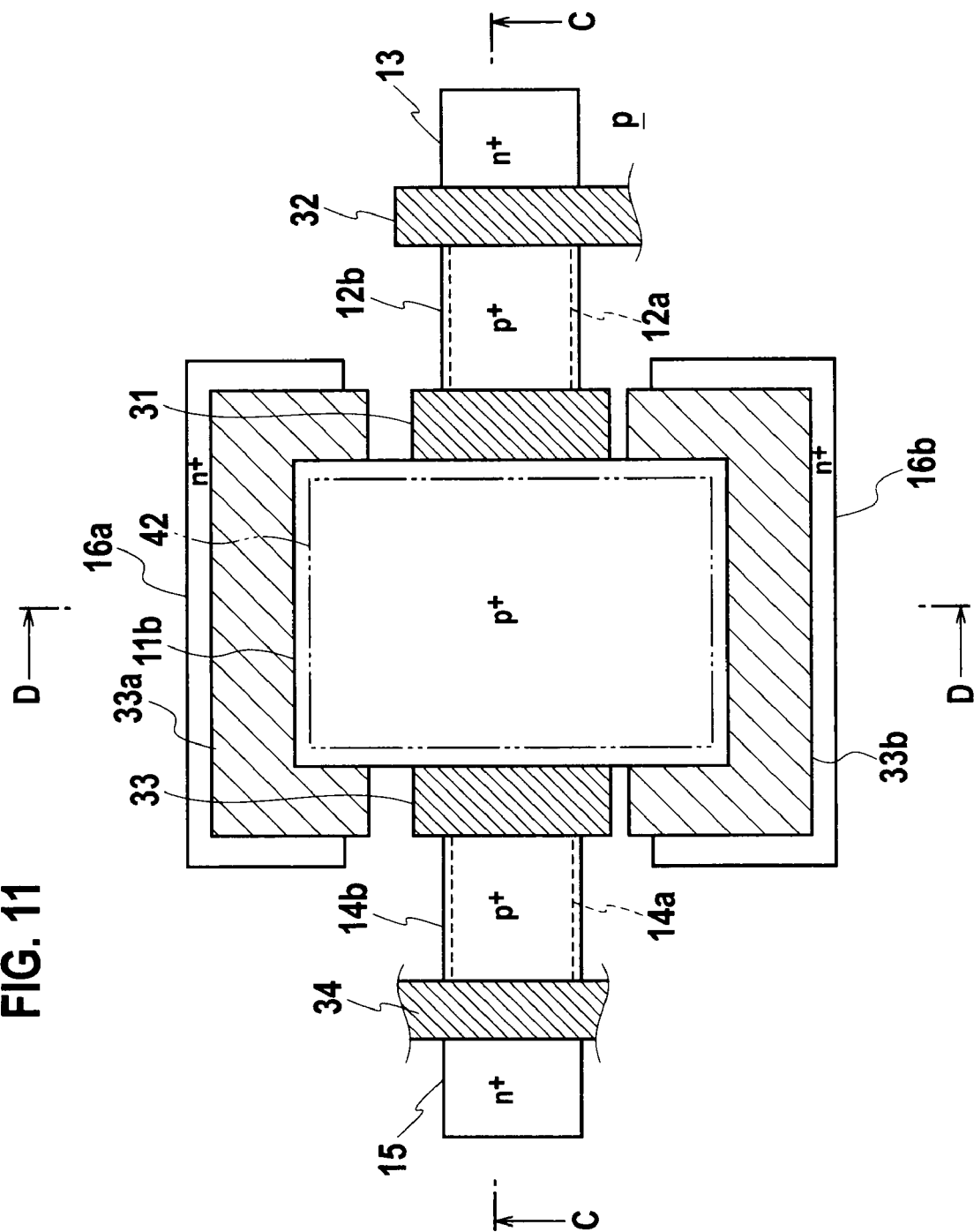
FIG. 11 is a schematic plan view describing a configuration of a semiconductor range-finding element that serves as a part of pixels of a solid-state imaging device pertaining to a second embodiment of the present invention.

Because an entire configuration of a solid-state imaging device (two-dimensional image sensor) pertaining to a second embodiment of the present invention is identical to the block diagram shown in FIG. 1, redundant descriptions are omitted. FIG. 11 shows an example of the planar structure of the semiconductor range-finding element that serves as a TOF pixel circuit, which is arranged in each of the pixels $X_{11}$ to $X_{1m}$; $X_{21}$ to $X_{2m}$; ... ; $X_{n1}$ to $X_{nm}$ in the solid-state imaging device pertaining to the second embodiment, and FIG. 12(a) shows the corresponding section.

Figure 12:
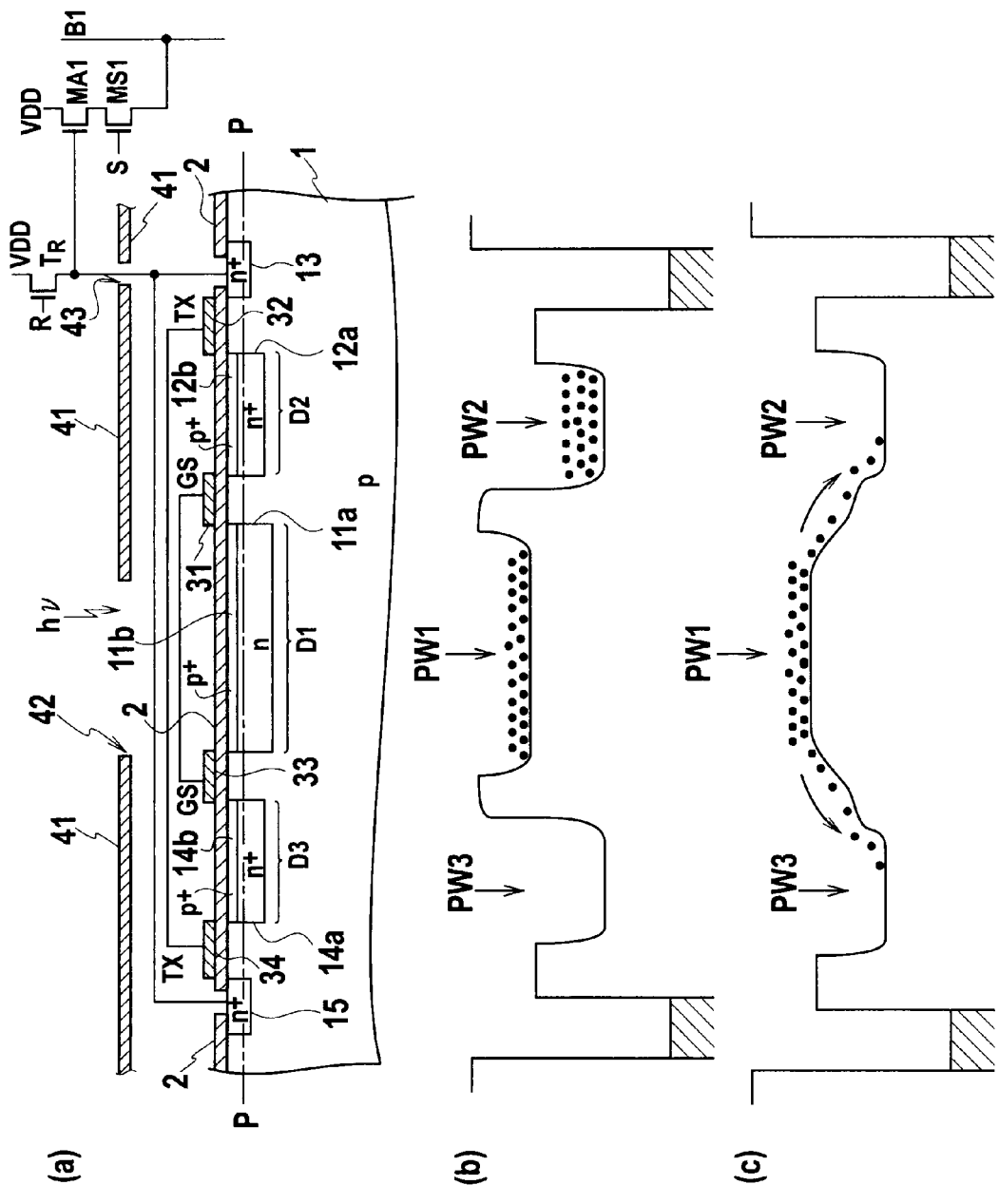
FIG. 12 (a) is a schematic cross-sectional view when viewed from a C-C plane in FIG. 11, FIG. 12 (b) is a potential diagram describing the way of the transferring of the signal charges, and FIG. 12 (c) is a potential diagram describing the way of the transferring of the signal charges.

Because FIG. 12 (a) is a cross-sectional structure viewed from the C-C plane of the semiconductor range-finding element shown in FIG. 11, and FIG. 12(a) is firstly described. As shown in FIG. 12(a), the semiconductor range-finding element encompasses a semiconductor substrate (semiconductor region) 1 having a first conductivity type (p-type), a light receiving surface-buried region (light-receiving cathode region) 11a having a second conductivity type (n-type) that is buried in the part of the upper portion of the semiconductor substrate 1 and receives the reflected light as the optical signal from the target sample and converts the optical signal into the signal charge, a first charge-accumulation region 12a and a second charge-accumulation region 14a of the second conductivity type ($n^+$-type) that are buried in the part of the upper portion of the semiconductor substrate 1 while separated from the light-receiving cathode region 11a oppositely to each other and accumulates signal charges generated in the light-receiving cathode region 11a, respectively, a first charge read-out region 13 for receiving the signal charges accumulated in the first charge-accumulation region 12a and a second charge read-out region 15 for receiving the signal charges accumulated in the second charge-accumulation region 14a.

The light-receiving cathode region 11a and the semiconductor substrate (anode region) 1 just under the light-receiving cathode region 11a implement the photodiode D1. The first charge-accumulation region (cathode region) 12a and the semiconductor substrate 1 (anode region) just under the first charge-accumulation region 12a implement a first charge accumulating diode D2. The second charge-accumulation region (cathode region) 14a and the semiconductor substrate 1 (anode region) just under the second charge-accumulation region 14a implement a second charge accumulating diode D3.

A $p^+$-type pinning layer 11b is arranged on the light-receiving cathode region 11a. A $p^+$-type pinning layer 12b is arranged on the first charge-accumulation region 12a. A $p^+$-type pinning layer 14b is arranged on the second charge-accumulation region 14a. In an application field in which dark current is not problematic and the like, the $p^+$-type pinning layers 11b, 12b and 14b may be structurally omitted.

An insulating film 2 is formed on the $p^+$-type pinning layers 11b, 12b and 14b. On the insulating film 2, a first transfer-gate electrode 31 for controlling a potential of a transfer-channel that is formed on the surface (upper portion) of the semiconductor substrate 1 between the light-receiving cathode region 11a and the first charge-accumulation region 12a and transferring signal charges from the light-receiving cathode region 11a to the first charge-accumulation region 12a is arranged to implement "a potential control means for a first charge-accumulation region". Moreover, on the insulating film 2, a first read-out gate electrode 32 for controlling a potential of a transfer-channel that is formed on the surface (upper portion) of the semiconductor substrate 1 between the first light charge-accumulation region 12a and the first charge read-out region 13 and transferring signal charges from the first charge-accumulation region 12a to the first charge read-out region 13 is arranged to implement "a potential control means for a first charge read-out region". Moreover, on the insulating film 2, a second transfer-gate electrode 33 for controlling a potential of a transfer-channel that is formed on the surface (upper portion) of the semiconductor substrate 1 between the light-receiving cathode region 11a and the second charge-accumulation region 14a and transferring signal charges from the light-receiving cathode region 11a to the second charge-accumulation region 14a is arranged to implement "a potential control means for a second charge-accumulation region". Moreover, on the insulating film 2, a second read-out gate electrode 34 for controlling a potential of a transfer-channel that is formed on the surface (upper portion) of the semiconductor substrate 1 between the second charge-accumulation region 14a and the second charge read-out region 15 and transferring signal charges from the second charge-accumulation region 14a to the second charge read-out region 15 is arranged to implement "a potential control means for a second charge read-out region".

A cross-sectional structure viewed from the D-D direction shown in FIG. 11 is shown in FIG. 14 (a). As shown in FIG. 14 (a), a first exhausting-drain region 16a and a second exhausting-drain region 16b are arranged in a part of the upper portion of the semiconductor substrate 1, being separated from the light-receiving cathode region 11a. As indicated in the planar structure in FIG. 11 and as can be understood from FIG. 12(a), a first exhaust-gate electrode 33a extends between the light-receiving cathode region 11a and the first exhausting-drain region 16a. Also, a second exhaust-gate electrode 33b extends between the light-receiving cathode region 11a and the second exhausting-drain region 16b.

As shown in FIG. 12 (a), the second charge read-out region 15 is short-circuited to the first charge read-out region 13 through a surface wiring, and the first charge read-out region 13 and the second charge read-out region 15 are connected to a gate electrode of a common signal read-out transistor (amplifying transistor) $MA_1$ so that the potential levels of the first charge read-out region 13 and the second charge read-out region 15 can be read out by the common signal read-out transistor (amplifying transistor).

As indicated in the planar structure in FIG. 11 and as can be understood from FIG. 12 (a), the first transfer-gate electrode 31 extends between the rectangular $p^+$-type pinning layer 11b arranged on the light-receiving cathode region 11a and the $p^+$-type pinning layer 11b arranged on the first charge-accumulation region 12a. The first read-out gate electrode 32 extends between the $p^+$-type pinning layer 12b arranged on the first charge-accumulation region 12a and the first charge read-out region 13. Moreover, the second transfer-gate electrode 33 extends between the rectangular $p^+$-type pinning layer 11b arranged on the light-receiving cathode region 11a and the $p^+$-type pinning layer 14b arranged on the second charge-accumulation region 14a. The second read-out gate electrode 34 extends between the $p^+$-type pinning layer 14b arranged on the second charge-accumulation region 14a and the second charge read-out region 15.

FIG. 12 (b) is a potential diagram on a cross-section by which the second charge read-out region 15, the second charge-accumulation region 14a, the light-receiving cathode region 11a, the first charge-accumulation region 12a and the first charge read-out region 13 are cut along the P-P plane indicated by the chain-dotted line, and the charges (electrons) are indicated by the filled circles. The left side in FIG. 12(b) shows a potential well (first potential well) PW1 of the conduction band edge of the light-receiving cathode region 11a. Moreover, a potential well (second potential well) PW2 of the conduction band edge of the first charge-accumulation region 12a is indicated on the right side of the first potential well PW1. The potential barrier between the first potential well PW1 and the second potential well PW2 corresponds to the potential profile of the conduction band edge of the semiconductor substrate 1 just under the first transfer-gate electrode 31. Moreover, on the right side of the second potential well PW2, a potential well of the first charge read-out region 13 is indicated by diagonal hatch with upward oblique lines to the right. The potential barrier between the second potential well PW2 and the potential well of the first charge read-out region 13 corresponds to the potential profile of the conduction band edge of the semiconductor substrate 1 just under the first read-out gate electrode 32.

Moreover, a potential well (third potential well) PW3 of the conduction band edge of the second charge-accumulation region 14a is indicated on the left side of the first potential well PW1. The potential barrier between the first potential well PW1 and the third potential well PW3 corresponds to the potential profile of the conduction band edge of the semiconductor substrate 1 just under the second transfer-gate electrode 33. Moreover, on the left side of the third potential well PW3, a potential well of the second charge read-out region 15 is indicated by diagonal hatch with upward oblique lines to the right. The potential barrier between the third potential well PW3 and the potential well of the second charge read-out region 15 corresponds to the potential profile of the conduction band edge of the semiconductor substrate 1 just under the second read-out gate electrode 34. Since the impurity concentration of the light-receiving cathode region 11a is higher than the impurity concentrations of the first charge-accumulation region 12a and the second charge-accumulation region 14a, the depths of the second potential well PW2 and the third potential well PW3 are deeper than the depth of the first potential well PW1.

As shown in FIG. 12 (b), when a low voltage (0 V or a negative voltage) as a control signal GS is applied to each of the first transfer-gate electrode 31 and the second transfer-gate electrode 33, signal charges are not transferred. Also, as shown in FIG. 12 (c), when a high voltage (a positive voltage) as the control signal GS is applied to each of the first transfer-gate electrode 31 and the second transfer-gate electrode 33, the signal charges of the light-receiving cathode region 11a can be transferred to each of the first charge-accumulation region 12a and the second charge-accumulation region 14a.

Figure 13:
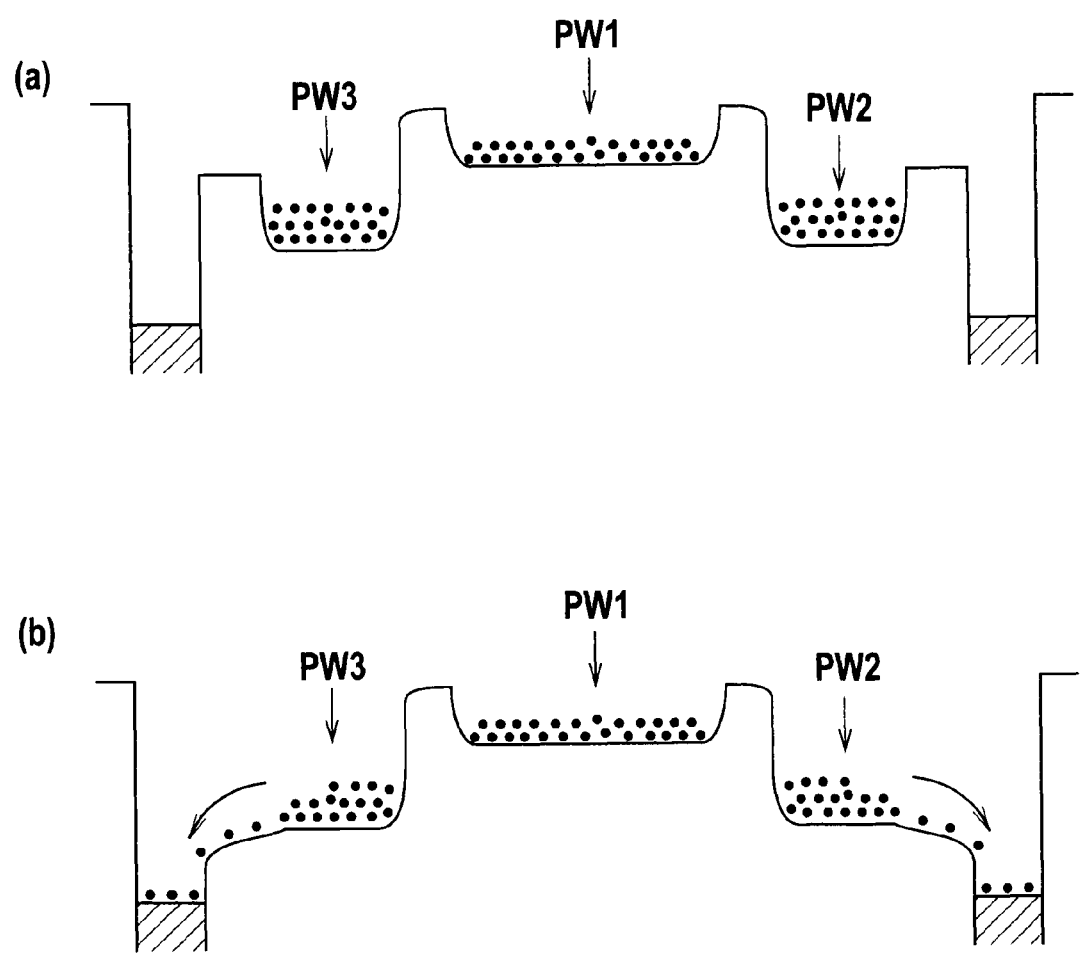
FIG. 13 (a) is a potential diagram describing the way of the transferring of the signal charges, and FIG. 13 (b) is a potential diagram describing the way of the transferring of the signal charges.

Also, as shown in FIG. 13 (a), since a low voltage (0 V or a negative voltage) as a control signal TX is applied to each of the first read-out gate electrode 32 and the second read-out gate electrode 34, the signal charges are not transferred. On the other hand, as shown in FIG. 13 (b), since a high voltage (a positive voltage) as the control signal TX is applied to each of the first read-out gate electrode 32 and the second read-out gate electrode 34, the signal charges stored in the first charge-accumulation region 12a and the second charge-accumulation region 14a can be transferred to each of the first charge read-out region 13 and the second charge read-out region 15.

In the second embodiment of the present invention, for example, when the control pulse signals TX are applied to the first transfer-gate electrode 31 and the second transfer-gate electrode 33 so that the signal charges are transferred to the left and right directions, and as the negative voltages are applied to a first exhaust-gate electrode 33a and a second exhaust-gate electrode 33b, and potential barriers are formed as shown in FIG. 14 (b) so that the charges are not transferred to the first exhausting-drain region 16a and the second exhausting-drain region 16b.

On the other hand, when the signal charges are scheduled to be extracted, as shown in FIG. 14 (c), high potentials are applied to the first exhaust-gate electrode 33a and the second exhaust-gate electrode 33b so that the signal charges can be extracted to the first exhausting-drain region 16a and the second exhausting-drain region 16b.

By the way, the scheme for applying voltage shown in FIG. 14(c) is the exemplification, and the voltages CD, which are applied to the first exhaust-gate electrode 33a and the second exhaust-gate electrode 33b that are located on the left and right sides of FIG. 14 (c), are not especially 3) required to be the same voltage. Thus, the signal charges can be extracted even if ± voltages are added to the first exhaust-gate electrode 33a and the second exhaust-gate electrode 33b. Also, even if the same plus voltage is applied to the first exhaust-gate electrode 33a and the second exhaust-gate electrode 33b as shown in FIG. 14 (c), the signal charges can be extracted. That is, because the various flexible voltages can be given as the voltages CD, which are applied to the first exhaust-gate electrode 33a and the second exhaust-gate electrode 33b that are located on the left and right sides of FIG. 14(c), by applying various voltages to the first exhaust-gate electrode 33a and the second exhaust-gate electrode 33b, the influence of the remnant signal charges can be effectively removed.

Because the operations of the solid-state imaging device pertaining to the second embodiment of the present invention are basically similar to the operations of the solid-state imaging device pertaining to the first embodiment of the present invention, the redundant descriptions are omitted.

As mentioned above, according to the semiconductor range-finding D element and the solid-state imaging device pertaining to the second embodiment, similarly to the first embodiment, because the manufacturing cost of the solid-state imaging device having a high range resolution can be reduced, with a simple structure, a TOF range-finding sensor in which the large number of the pixels are arranged so as to achieve a high space resolution can be provided.

<First Modification of Second Embodiment>

As a scheme for applying control signal to semiconductor range-finding elements, which are arranged in each of the pixels $X_{11}$ to $X_{1m}$; $X_{21}$ to $X_{2m}$; . . . ; $X_{n1}$ to $X_{nm}$ in a solid-state imaging device pertaining to a modification of the second embodiment of the present invention, in the configuration shown in FIG. 12, the first transfer-gate electrode 31 is assigned to the first repetition period (odd-numbered frames), and the second transfer-gate electrode 33 is assigned to the second repetition period (even-numbered frames), and the control signals GS=GS(A), GS2=GS(B) independent of each other may be applied to the first transfer-gate electrode 31 and the second transfer-gate electrode 33, where the GS(A) and the GS(B) are the controls signals shown in FIG. 6. When the control signals GS=GS(A), GS2=GS(B) are set to different values and then applied to each of the first transfer-gate electrode 31 and the second transfer-gate electrode 33, in the first repetition period (odd-numbered frames), the signal charges can be transferred to the first charge-accumulation region 12a, and in the second repetition period (even-numbered frames), the signal charges can be transferred to the second charge-accumulation region 14a so that they are independent of each other. For example, in a situation that a low voltage (0 V or a negative voltage) as the control signal GS2 is applied to the second transfer-gate electrode 33, when a high voltage (a positive voltage) as the control signal GS1=GS(A) is applied to the first transfer-gate electrode 31, the signal charges of the light-receiving cathode region 11a can be transferred to only the first charge-accumulation region 12a.

When the first charge read-out region 13 and the second charge read-out region 15 are short-circuited through a surface wiring and then the first charge read-out region 13 and the second charge read-out region 15 are connected to the gate electrode of the common signal read-out transistor (amplifying transistor) $MA_1$, the number of the transistors in one pixel can be reduced, and further, because the charge detection is carried out in a same diffusion layer whose potential is common, the performance of a conversion gain and the like can be made equal, thereby improving the precision. Therefore, FIG. 12 (a) shows the configuration in which the potentials of the first charge read-out region 13 and the second charge read-out region 15 are read out by a single common signal read-out transistor (amplifying transistor).

<Second Modification of Second Embodiment>

Figure 15:
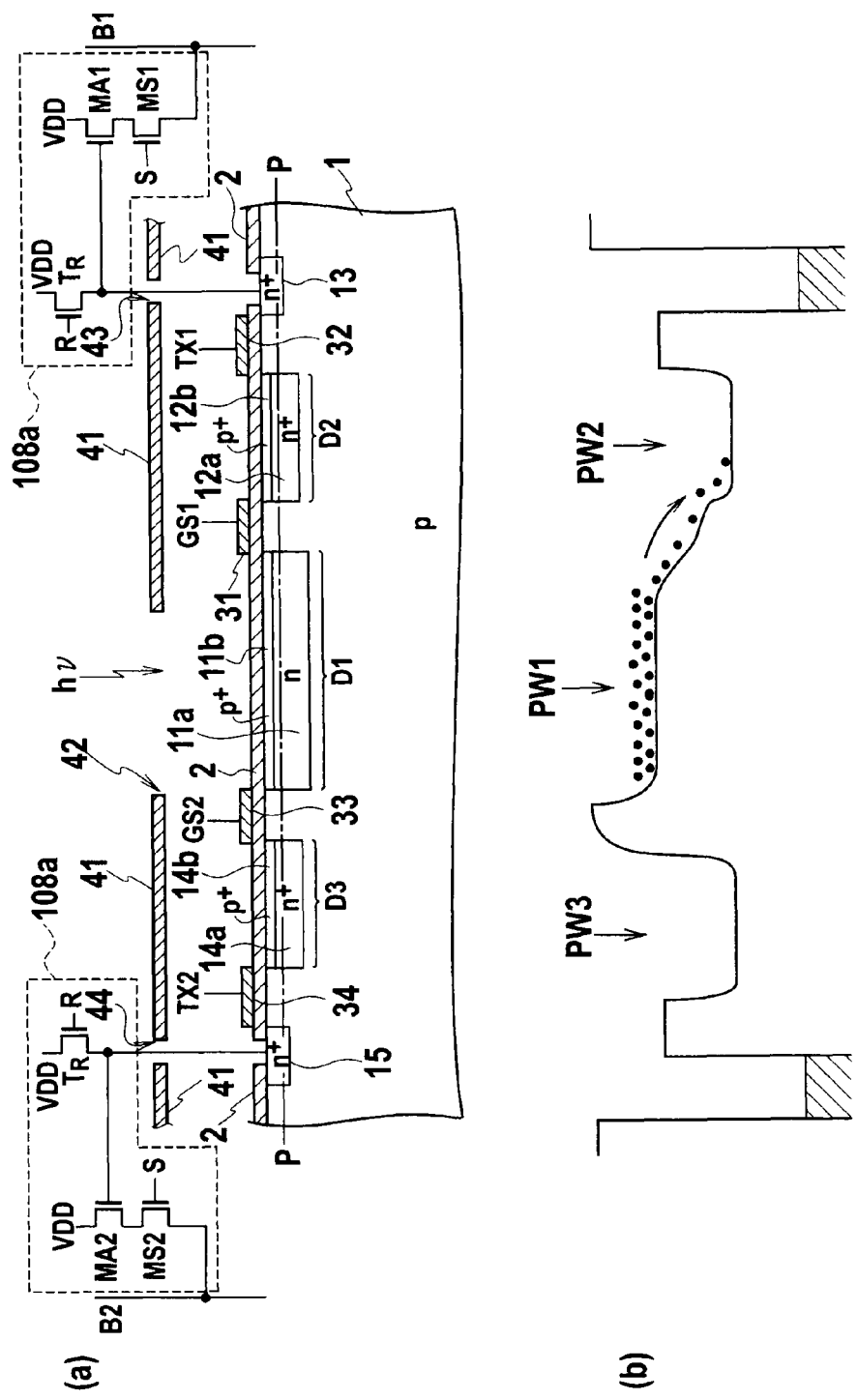
FIG. 15 (a) is another schematic cross-sectional view when viewed from the C-C plane in FIG. 11, and FIG. 15 (b) is a potential diagram describing the way of the transferring of the signal charges.

Although there is a disadvantage that the structure of a pixel becomes complex, as shown in FIG. 15 (a), a first voltage read-out buffer amplifier 108a and a second voltage read-out buffer amplifier 108b may be connected respectively to a first charge read-out region 13 and a second charge read-out region 15, which are independent of each other. A gate electrode of a signal read-out transistor (amplifying transistor) $MA_1$ that implements the first voltage read-out buffer amplifier 108a is connected to the first charge read-out region 13. A drain electrode of the signal read-out transistor (amplifying transistor) $MA_1$ is connected to a power supply VDD, and a source electrode of the signal read-out transistor (amplifying transistor) $MA_1$ is connected to a drain electrode of a switching transistor $MS_1$ for pixel selection. A source electrode of the switching transistor $MS_1$ for pixel selection is connected to a vertical signal line $B_1$, and a control signal S for selecting a horizontal line is applied to a gate electrode of the switching transistor $MS_1$ from the vertical shift register 105.

On the other hand, a gate electrode of a signal read-out transistor (amplifying transistor) $MA_2$ in the second voltage read-out buffer amplifier 108b is connected to the second charge read-out region 15. A drain electrode of a signal read-out transistor (amplifying transistor) $MA_2$ is connected to the power supply VDD, and a source electrode of the signal read-out transistor (amplifying transistor) $MA_2$ is connected to a drain electrode of a switching transistor $MS_2$ for pixel selection. A source electrode of the switching transistor $MS_2$ for pixel selection is connected to a vertical signal line $B_2$, and the control signal S for selecting a horizontal line is applied to a gate electrode of the switching transistor $MS_2$ from the vertical shift register 105.

In the second modification, similarly to the first modification, the first transfer-gate electrode 31 is assigned to the first repetition period (odd-numbered frames), and the second transfer-gate electrode 33 is assigned to the second repetition period (even-numbered frames), and the control signals GS1=GS and GS2, which are independent of each other, are given. Moreover, the control signals TX1, TX2 independent of each other are applied to the first read-out gate electrode 32 in the first repetition period (odd-numbered frames) and are applied to the second read-out gate electrode 34 in the second repetition period (even-numbered frames).

For example, as shown in FIG. 15 (b), in the first repetition period (odd-numbered frames), in a situation that a low voltage (0 V or a negative voltage) as the control signal GS2 is applied to the second transfer-gate electrode 33, since a high voltage (positive voltage) as the control signal GS1=GS(A) is applied to the first transfer-gate electrode 31, the signal charges of the light-receiving cathode region 11a can be transferred to only the first charge-accumulation region 12a.

Figure 16:
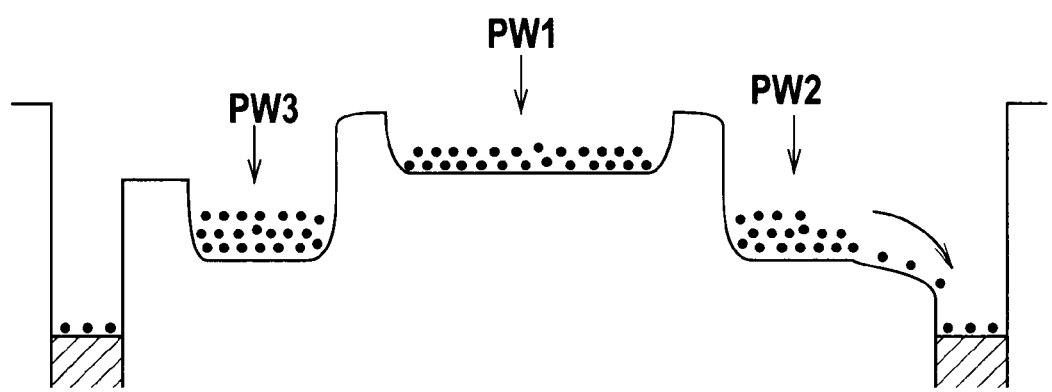
FIG. 16 is a potential diagram describing the way of the transferring of the signal charges.

And, for example, as shown in FIG. 16, in the first repetition period (odd-numbered frames), in a situation that the low voltage (0 V or the negative voltage) as the control signal TX2 is applied to the second read-out gate electrode 34, since the high voltage (positive voltage) as the control signal TX1 is applied to the first read-out gate electrode 32, the signal charges of the first charge-accumulation region 12a can be transferred to only the first charge-accumulation region 12a.

When the select-control signal S is set to the high level, the switching transistors $MS_1$, $MS_2$ are turned on, and the currents, which are amplified by the signal read-out transistors (amplifying transistors) $MA_1$, $MA_2$ and correspond to the potentials of the first charge read-out region 13 and the second charge read-out region 15, flow into the vertical signal lines $B_1$, $B_2$.

Other Embodiments

While the present invention is described in accordance with the aforementioned first and second embodiments, it should not be understood that the description and drawings that implement a part of the disclosure are to limit the scope of the present invention. In view of aforementioned disclosure, it will be clear that there are a variety of alternative embodiments, examples and operational techniques for those skilled in the art.

For example, in the description of the already-described first and second embodiments, although "the first repetition period" is assigned to the period of the odd-numbered frames, and "the second repetition period" is assigned to the period of the even-numbered frames, the first and second repetition periods are not limited to such assignment. By skipping several frames, "the first repetition period" and "the second repetition period" may be assigned. Also, although the aforementioned first and second embodiments are described under the assumption that the first conductivity type is assigned as p-type and the second conductivity type is assigned as n-type, because these assignment are only for exemplification, even under the assumption that the first conductivity type is the n-type and the second conductivity type is the p-type, when the electric polarity is made opposite, the achievement of the similar effectiveness may be easily understood.

Also, in the descriptions of the first and second embodiments, although the TOF range-finding sensor as the two-dimensional solid-state imaging device (area sensor) is exemplified, it should not be limitedly construed that the semiconductor range-finding element of the present invention is used only for the pixel of the two-dimensional solid-state imaging device. For example, it should be easily understood from the contents of the foregoing disclosures that a plurality of semiconductor range-finding elements may be one-dimensionally arranged by setting j=m=1 in the two-dimensional matrix shown in FIG. 1, and the semiconductor range-finding elements can serve as the pixels of a one-dimensional solid-state imaging device (line sensor).

Figure 17:
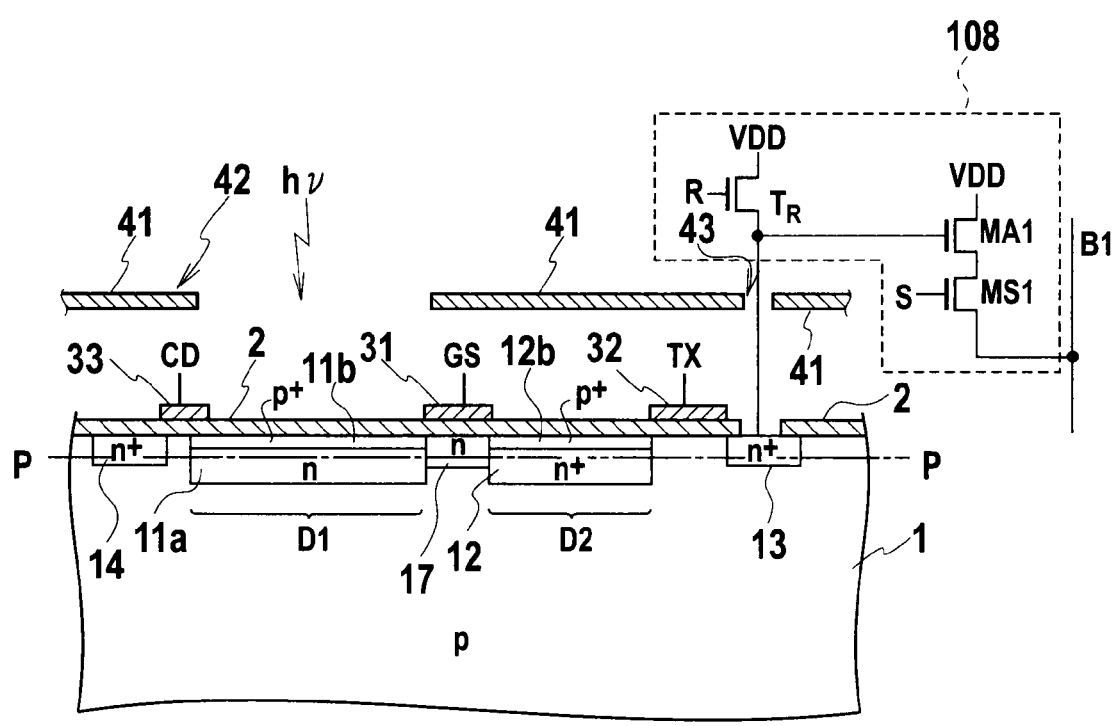
FIG. 17 is a schematic plan view describing a configuration of a semiconductor range-finding element according to a solid-state imaging device pertaining to another embodiment of the present invention.

Also, the first and second embodiments are described in a case that the transferring means is implemented by normal-off (enhancement) type nMOSFET, in which the positive bias as the control signal GS is applied to the transfer-gate electrode (first potential control means) 31 so as to form an inversion layer between the light-receiving cathode region 11a and the charge-accumulation region 12a so that the signal charges can be transferred. However, as shown in FIG. 17, the transferring means may be implemented by normal-on (deletion) type nMOSFET, in which a surface-buried region 17 of the n-type (second conductivity type) is formed as an n-type channel region between the light-receiving cathode region 11a of the n-type (second conductivity type) just under the transfer-gate electrode 31 and the charge-accumulation region 12a of the n-type (second conductivity type). In the case of the structure shown in FIG. 17, the situation in which 0 V (a ground potential) as the control signal GS is applied to the transfer-gate electrode 31 corresponds to the potential diagram shown in FIG. 4(a) that is described in the first embodiment, in which the signal charges are transferred from the light-receiving cathode region 11a to the charge-accumulation region 12a. To establish the corresponding potential diagram as shown in FIG. 3 (b), forming the potential barrier against the electrons between the first potential well PW1 and the second potential well PW2 so that the signal charges are avoided from being transferred to the charge-accumulation region 12a from the light-receiving cathode region 11a, a negative voltage as the control signal GS may be applied to the transfer-gate electrode 31. That is, in the case of the structure shown in FIG. 17, a pulse of the polarity opposite to the cases of the structures described in the first and second embodiments is used as the control signal GS applied to the gate electrode 31.

Because, by providing a surface-buried region of the second conductivity type just under the transfer-gate electrode 31, and the normal-on (deletion) type MOSFET is established, which can suppress the influence of the interface state between the insulating film 2 and the semiconductor region (semiconductor substrate) 1, or the surface potential, the signal charges can be transferred at the higher speed. With such higher speed transferring of the charges, the afterimage can be protected more effectively, and the generation of the random noise caused by the remnant charges can be protected more effectively. By the way, in FIG. 17, for convenience that the P-P plane, on which the potential diagrams of FIG. 3 (b), FIG. 4 (a) and the like are manifested, can be illustrated by the chain-dotted line, the depth of the surface-buried region 17 is illustrated deeply with exaggeration. Actually, the depth of the surface-buried region 17 may be formed shallowly at the depth similar to the depths of the p$^+$-type pinning layer 11b and the p$^+$-type pinning layer 12b.

Annealing can form the n-type surface-buried region 17 shown in FIG. 17, after the n-type impurity ions are implanted into the semiconductor substrate 1, similarly to the case of forming the light-receiving cathode region 11a and the charge-accumulation region 12a, although the number of process steps is increased.

Also, the n-type channel region may be formed between the charge-accumulation region 12a and the charge read-out region 13 and between the light-receiving cathode region 11a and the exhausting-drain region 14, respectively.

In this way, the present invention may naturally include various embodiments not described herein. Therefore, the technical scope of the present invention should be defined only by features for specifying the invention according to the appended claims that are regarded appropriate according to the above description.

Industrial Applicability

According to the present invention, it is possible to provide a semiconductor range-finding element in which a high speed charge transfer can be carried out, and it is further possible to provide a solid-state imaging device in which a plurality of semiconductor range-finding elements are arrayed as pixels, the solid-state imaging device has a high range resolution and a high space resolution, and can be manufactured at low cost. Thus, the solid-state imaging device of the present invention can be applied to a field of the range-finding sensor for a car and a field of acquisition or generation of a three-dimensional picture. Moreover, the solid-state imaging device of the present invention can be also used in a field of operational analysis of a sport player and a game machine, in which the three-dimensional picture is used.

The invention claimed is:

1. A CMOS imaging device including a plurality of pixels being arrayed, each of the pixels comprising:
   a semiconductor region of a first conductivity type;
   a light receiving surface-buried region of a second conductivity type buried in a part of an upper portion of the semiconductor region, to which a light reflected by a target sample is entered;
   a first charge-accumulation region of the second conductivity type buried in a part of the upper portion of the semiconductor region, a depth of a potential well of the first charge-accumulation region is deeper than the light receiving surface-buried region, and to which signal charges generated by the light are transferred from the light receiving surface-buried region;
   a first charge read-out region configured to receive the signal charges from the first charge-accumulation region;
   a first potential control means configured to control a potential of a first channel, the first channel being formed in a part of the upper portion of the semiconductor region between the light receiving surface-buried region and the first charge-accumulation region configured to transfer the signal charges from the light receiving surface-buried region to the first charge-accumulation region;

a second potential control means configured to control a potential of a second channel, the second channel being formed in a part of the upper portion of the semiconductor region between the first charge-accumulation region and the first charge read-out region configured to transfer the signal charges from the first charge-accumulation region to the first charge read-out region;

a reset transistor having a source electrode connected to the first charge read-out region, configured to extract accumulated charges in the first charge read-out region, before the signal charges are transferred to the first charge read-out region from the first charge-accumulation region;

a signal read-out transistor having a gate electrode connected to the first charge read-out region configured to read out a signal level corresponding to an amount of the signal charges accumulated in the first charge read-out region;

a first exhausting-drain region configured to extract the charges from the light receiving surface-buried region; and a third potential control means configured to control a potential of a third channel, the third channel being formed in a part of the upper portion of the semiconductor region between the light receiving surface-buried region and the first exhausting-drain region configured to transfer the signal charges from the light receiving surface-buried region to the first exhausting-drain region, wherein the signal charges dependent on a delay time of the reflected light are repeatedly transferred from the light receiving surface-buried region to the first charge-accumulation region so as to be accumulated as a first signal charge in the first charge-accumulation region in a first repetition period, all of the signal charges generated by the reflected light are repeatedly transferred from the light receiving surface-buried region so as to be accumulated as a second signal charge in the first charge-accumulation region in a second repetition period, and a ratio between total quantities of the accumulated first and second signal charges is calculated so as to measure a range to the target sample based upon the signal levels read out by the signal read-out transistor.

2. The CMOS imaging device of claim 1, wherein the light receiving surface-buried region is implemented by a plurality of striped patterns mutually buried in the surface of the semiconductor region.

3. The CMOS imaging device of claim 1, wherein the first charge-accumulation region has an impurity concentration higher than the light receiving surface-buried region.

4. The CMOS imaging device of claim 1, wherein the charges are extracted to the first exhausting-drain region from the light receiving surface-buried region when the signal charges are not transferred to the first charge-accumulation region from the light receiving surface-buried region.

5. The CMOS imaging device of claim 1, wherein each of the plurality of pixels further comprises a voltage read-out buffer amplifier configured to read out a voltage dependent on the signal charges which are transferred to the first charge read-out region.

6. The CMOS imaging device of claim 1, wherein the signal charges are transferred simultaneously to the first charge-accumulation regions from the light receiving surface-buried regions in all of the pixels.

7. The CMOS imaging device of claim 1, further comprising:

a second charge-accumulation region of the second conductivity type buried in a part of the upper portion of the semiconductor region separated from the first charge-accumulation region, a depth of a potential well of the second charge-accumulation region is deeper than the light receiving surface-buried region, to which the signal charges generated by the light are transferred from the light receiving surface-buried region;

a second charge read-out region configured to receive the signal charges from the second charge-accumulation region;

a fourth potential control means configured to control a potential of a fourth channel, the fourth channel being formed in a part of the upper portion of the semiconductor region between the light receiving surface-buried region and the second charge-accumulation region, configured to transfer the signal charges to the second charge-accumulation region from the light receiving surface-buried region; and a fifth potential control means configured to control a potential of a fifth channel, the fifth channel being formed in a part of the upper portion of the semiconductor region between the second charge-accumulation region and the second charge read-out region, configured to transfer the signal charges to the second charge read-out region from the second charge-accumulation region.

8. The CMOS imaging device of claim 7, wherein the second charge-accumulation region has an impurity concentration higher than the light receiving surface-buried region, or the second charge-accumulation region is deeper than the light receiving surface-buried region.

9. The CMOS imaging device of claim 7, further comprising:

a second exhausting-drain region configured to extract the charges from the light receiving surface-buried region; and a sixth potential control means configured to control a potential of a sixth channel, the sixth channel being formed in a part of the upper portion of the semiconductor region between the light receiving surface-buried region and the second exhausting-drain region, configured to transfer the signal charges to the second exhausting-drain region from the light receiving surface-buried region.

10. The CMOS imaging device of claim 7, wherein each of the plurality of pixels further comprises a common voltage read-out buffer amplifier configured to read out the voltages dependent on the signal charges being transferred to the first and second charge read-out regions, respectively.

11. The CMOS imaging device of claim 7, wherein each of the plurality of pixels further comprises first and second voltage read-out buffer amplifiers configured to read out the voltages dependent on the signal charges, respectively, which are transferred to the first and second charge read-out regions.

* * * * *